United States Patent
Lin et al.

(10) Patent No.: US 9,257,204 B2
(45) Date of Patent: Feb. 9, 2016

(54) READ VOLTAGE SETTING METHOD, AND CONTROL CIRCUIT, AND MEMORY STORAGE APPARATUS USING THE SAME

(71) Applicant: PHISON ELECTRONICS CORP., Miaoli (TW)

(72) Inventors: Wei Lin, Taipei (TW); Yu-Cheng Hsu, Yilan County (TW); Siu-Tung Lam, Hsinchu (TW); Tzung-Lin Wu, Hsinchu (TW); Kuo-Yi Cheng, Taipei (TW)

(73) Assignee: PHISON ELECTRONICS CORP., Miaoli (TW)

( * ) Notice: Subject to any disclaimer, the term of this patent is extended or adjusted under 35 U.S.C. 154(b) by 252 days.

(21) Appl. No.: 14/018,436

(22) Filed: Sep. 5, 2013

(65) Prior Publication Data

US 2015/0006983 A1 Jan. 1, 2015

(30) Foreign Application Priority Data

Jun. 28, 2013 (TW) .............................. 102123267 A

(51) Int. Cl.
  *G11C 29/00* (2006.01)
  *G11C 29/50* (2006.01)
  *G11C 16/26* (2006.01)
  *G11C 29/02* (2006.01)
  *G11C 16/34* (2006.01)
  *G11C 16/00* (2006.01)

(52) U.S. Cl.
  CPC .......... *G11C 29/50004* (2013.01); *G11C 16/26* (2013.01); *G11C 16/3459* (2013.01); *G11C 29/021* (2013.01); *G11C 29/028* (2013.01); *G11C 16/00* (2013.01)

(58) Field of Classification Search
  CPC .... G11C 11/5642; G11C 16/26; G11C 16/00; G11C 29/021; G11C 29/028; G11C 29/50004

USPC ......................................................... 714/721
See application file for complete search history.

(56) References Cited

U.S. PATENT DOCUMENTS

| | | | |
|---|---|---|---|
| 8,023,323 B2 * | 9/2011 | Kang et al. ................ | 365/185.03 |
| 2009/0003058 A1 * | 1/2009 | Kang ........................ | 365/185.03 |
| 2009/0168543 A1 * | 7/2009 | Kim et al. ................. | 365/185.29 |
| 2010/0296350 A1 * | 11/2010 | Kim et al. ................. | 365/189.15 |
| 2012/0079353 A1 | 3/2012 | Liikanen et al. | |

FOREIGN PATENT DOCUMENTS

TW 201207621 2/2012

OTHER PUBLICATIONS

"Office Action of Taiwan Counterpart Application", issued on Aug. 19, 2015, p. 1-p. 9.

* cited by examiner

*Primary Examiner* — David Ton
(74) *Attorney, Agent, or Firm* — Jianq Chyun IP Office

(57) ABSTRACT

A read voltage setting method for a rewritable non-volatile memory module is provided. The method includes: reading test data stored in memory cells of a word line to obtain a corresponding critical voltage distribution and identifying a default read voltage corresponding to the word line based on the corresponding critical voltage distribution; applying a plurality of test read voltages obtained according to the default read voltage to the word line to read a plurality of test page data; and determining an optimized read voltage corresponding to the word line according to the minimum error bit number among a plurality of error bit numbers of the test page data. The method further includes calculating a difference value between the default read voltage and the optimized read voltage as a read voltage adjustment value corresponding to the word line and recording the read voltage adjustment value in a retry table.

21 Claims, 15 Drawing Sheets

US 9,257,204 B2

READ VOLTAGE SETTING METHOD, AND CONTROL CIRCUIT, AND MEMORY STORAGE APPARATUS USING THE SAME

CROSS-REFERENCE TO RELATED APPLICATION

This application claims the priority benefit of Taiwan application serial no. 102123267, filed on Jun. 28, 2013. The entirety of the above-mentioned patent application is hereby incorporated by reference herein and made a part of this specification.

BACKGROUND

1. Technology Field

The present invention relates to a read voltage setting method, and a control circuit, and a memory storage apparatus using the same.

2. Description of Related Art

Along with the widespread of digital cameras, cell phones, and MP3 in recently years, the consumers' demand for storage media has increased drastically. Since a rewritable non-volatile memory has the characteristics of non-volatility of data, low power consumption, small volume, non-mechanical structure, and fast reading and writing speed, the rewritable non-volatile memory is the most adaptable memory to be applied in a portable electronic product, e.g., a notebook computer. A solid state drive (SSD) is a storage apparatus which utilizes a flash memory as its storage medium. Therefore, the flash memory industry has become a very popular part of the electronic industry in recent years.

FIG. 1 is a schematic diagram illustrating a flash memory device according to the related art.

Referring to FIG. 1, a flash memory device 1 includes a charge-trapping layer 2 for storing electrons, a control gate 3 for applying a voltage, a tunnel oxide layer 4, and an interpoly dielectric layer 5. When it is intended to write data into the flash memory device 1, a threshold voltage of the flash memory device 1 may be changed by injecting electrons into the charge-trapping layer 2. Accordingly, a digital-level state of the flash memory device 1 is defined to implement a function of storing data. Here, the process of injecting the electrons to the charge-trapping layer 2 is referred to as a programming process. By contrast, when it is intended to remove the stored data, the injected electrons are removed from the charge-trapping layer 2, and thereby the flash memory device 1 is restored back to the default state before programming.

However, during the manufacture of the flash memory device 1, a critical voltage distribution of the flash memory device 1 may shift due to the variation of the manufacturing process. As a result, the storage state of the flash memory device 1 is unlikely to be identified accurately, which results in the occurrence of error bits.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

Accordingly, the present invention is directed to a read voltage setting method, a control circuit and a memory storage apparatus using the method, which can correctly identify storage states of memory cells according to a critical voltage distribution of memory cells.

In an exemplary embodiment of the present invention, a read voltage setting method for a rewritable non-volatile memory module is provided, wherein the rewritable non-volatile memory module has a plurality of memory cells, a plurality of word lines and a plurality of bit lines, each of the memory cells electrically connected to one of the word lines and one of the bit lines, each of the memory cells may store a plurality of bit data, each of the bit data may be identified as a first state or a second state based on a voltage. The read voltage setting method includes programming data into a plurality of memory cells connected to a first word line among the word lines; reading the data stored in the memory cells of the first word line to obtain a critical voltage distribution corresponding to the memory cells of the first word line; and determining a first default read voltage corresponding to the first word line according to a peak value of the critical voltage distribution corresponding to the memory cells of the first word line.

In an exemplary embodiment of the present invention, a read voltage setting method for a rewritable non-volatile memory module is provided, wherein the rewritable non-volatile memory module has a plurality of memory cells, a plurality of word lines and a plurality of bit lines, each of the memory cells electrically connected to one of the word lines and one of the bit lines, each of the memory cells may store a plurality of bit data, each of the bit data may be identified as a first state or a second state based on a voltage. The read voltage setting includes: programming data into a plurality of memory cells connected to a first word line among the word lines; adjusting a first default read voltage to obtain a plurality of first test read voltages; respectively applying the first test read voltages to the first word line to read a plurality of first page data; obtaining an error bit number corresponding to each of first page data according to the data and the first page data; and determining a first optimized read voltage corresponding to the first word line from the first test read voltages according to the minimum error bit number among the error bit numbers. The read voltage setting method further includes calculating a difference value between the first optimized read voltage and the first default read voltage as a first read voltage adjustment value corresponding to the first word line; and recording the first read voltage adjustment value corresponding to the first word line in a retry table.

According to an exemplary embodiment of the present invention, a control circuit for accessing a rewritable non-volatile memory module is provided. The control circuit includes an interface and a memory management circuit. The interface is configured to couple to the rewritable non-volatile memory module, wherein the rewritable non-volatile memory module has a plurality of memory cells, a plurality of word lines and a plurality of bit lines, each of the memory cells electrically connected to one of the word lines and one of the bit lines, each of the memory cells may store a plurality of bit data, each of the bit data may be identified as a first state or a second state based on a voltage. The memory management circuit is coupled to the interface and configured to program data into a plurality of memory cells connected to a first word line among the word lines. Additionally, the memory management circuit is further configured to read the data stored in the memory cells of the first word line to obtain a critical voltage distribution corresponding to the memory cells of the first word line; and determine a first default read voltage corresponding to the first word line according to a peak value of the critical voltage distribution corresponding to the memory cells of the first word line.

According to an exemplary embodiment of the present invention, a memory storage apparatus including a connector, a rewritable non-volatile memory module and a memory controller is provided. The connector is coupled to a host system. The rewritable non-volatile memory module has a plurality of memory cells, a plurality of word lines and a plurality of bit lines, each of the memory cells electrically connected to one of the word lines and one of the bit lines, each of the memory cells may store a plurality of bit data, each of the bit data may be identified as a first state or a second state based on a voltage. The memory controller is coupled to the connector and the rewritable non-volatile memory module and configured to program data into a plurality of memory cells connected to a first word line among the word lines. Additionally, the memory controller is further configured to read the data stored in the memory cells of the first word line to obtain a critical voltage distribution corresponding to the memory cells of the first word line; and determine a first default read voltage corresponding to the first word line according to a peak value of the critical voltage distribution corresponding to the memory cells of the first word line.

Accordingly, the read voltage setting method, the control circuit and the memory storage apparatus of the present exemplary embodiments can adjust default read voltages by using appropriate voltage values according to a critical voltage distribution of the memory cells, thereby correctly identifying storage states of memory cells of a rewritable non-volatile memory module having a defect generated due to a manufacturing process.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

In order to make the aforementioned features and advantages of the present invention more comprehensible, embodiments accompanying figures are described in detail below.

DESCRIPTION OF EMBODIMENTS

Figure 1:
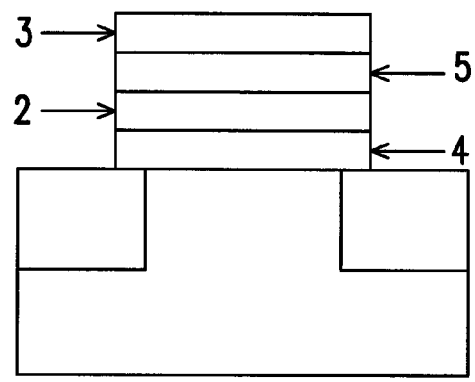
FIG. 1 is a schematic diagram illustrating a flash memory device according to the related art.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

A memory storage apparatus (i.e., a memory storage system) typically includes a rewritable non-volatile memory module and a controller (i.e., a control circuit). The memory storage apparatus is usually used together with a host system, such that the host system can write data into or read data from the memory storage apparatus.

Figure 2:
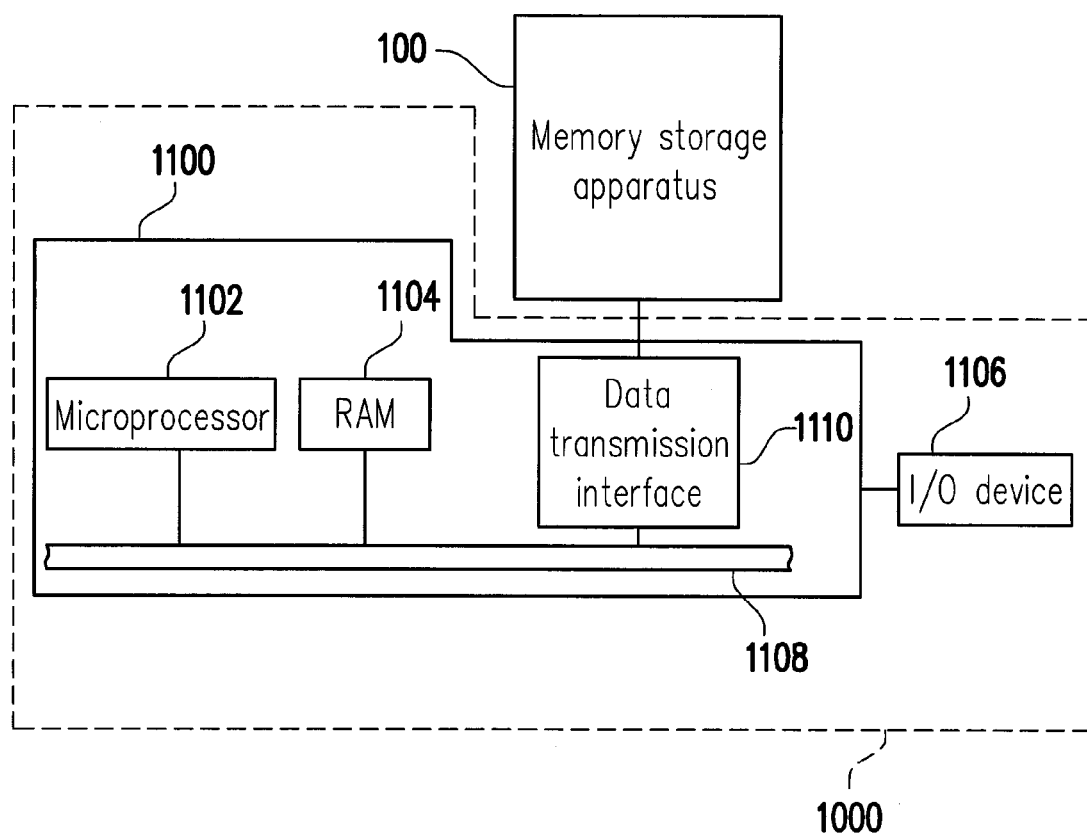
FIG. 2 illustrates a host system and a memory storage apparatus according to an exemplary embodiment.

FIG. 2 illustrates a host system and a memory storage apparatus according to an exemplary embodiment.

Figure 3:
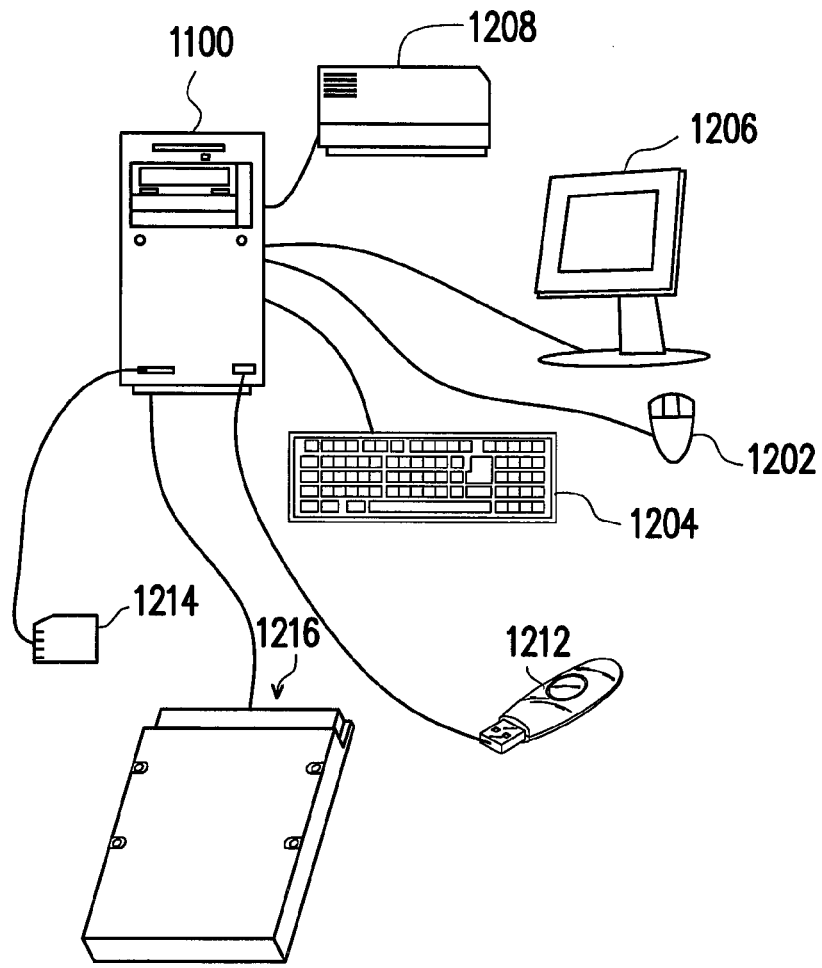
FIG. 3 schematically illustrates a computer, an input/output (I/O) device, and a memory storage apparatus according to an exemplary embodiment.

Referring to FIG. 2, a host system 1000 usually includes a computer 1100 and an input/output (I/O) device 1106. The computer 1100 includes a microprocessor 1102, a random access memory (RAM) 1104, a system bus 1108, and a data transmission interface 1110. The I/O device 1106 includes a mouse 1202, a keyboard 1204, a display 1206, and a printer 1208, as shown in FIG. 3. It should be understood that, the devices depicted in FIG. 3 should not be construed as limitations to the present disclosure, and the I/O device 1106 may include other devices as well.

In the exemplary embodiment of the present invention, the memory storage apparatus 100 is coupled to other devices of the host system 1000 through the data transmission interface 1110. By using the microprocessor 1102, the RAM 1104, and the I/O device 1106, the data can be written into or read from the memory storage apparatus 100. For instance, the memory storage apparatus 100 may be a non-volatile memory storage apparatus, such as a flash drive 1212, a memory card 1214, or a solid state drive (SSD) 1216 as shown in FIG. 3.

Figure 4:
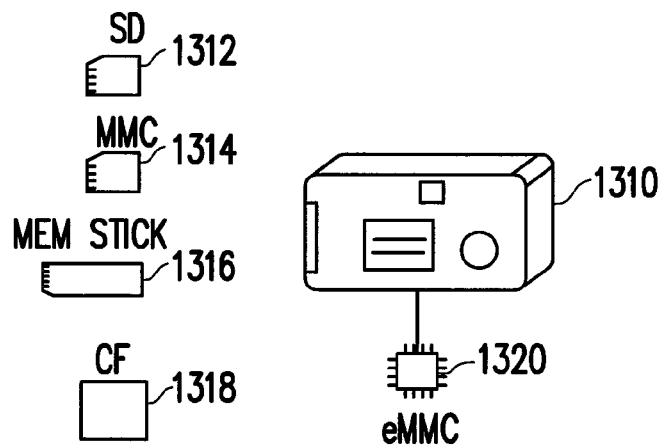
FIG. 4 illustrates a host system and a memory storage apparatus according to an exemplary embodiment.

Generally, the host system 1000 can substantially be any system used together with the memory storage apparatus 100 for storing data. Even though the host system 1000 is described as a computer system in the present exemplary embodiment, the host system 1000 in another exemplary embodiment may be a digital camera, a video camera, a communication device, an audio player, a video player, and so on. For instance, if the host system is a digital camera (video camera) 1310, the rewritable non-volatile memory storage apparatus is an SD card 1312, an MMC card 1314, a memory stick 1316, a CF card 1318n or an embedded storage apparatus 1320 (as shown in FIG. 4). The embedded storage device 1320 includes an embedded MMC (eMMC). It should be noted that the eMMC is directly coupled to a substrate of the host system.

Figure 5:
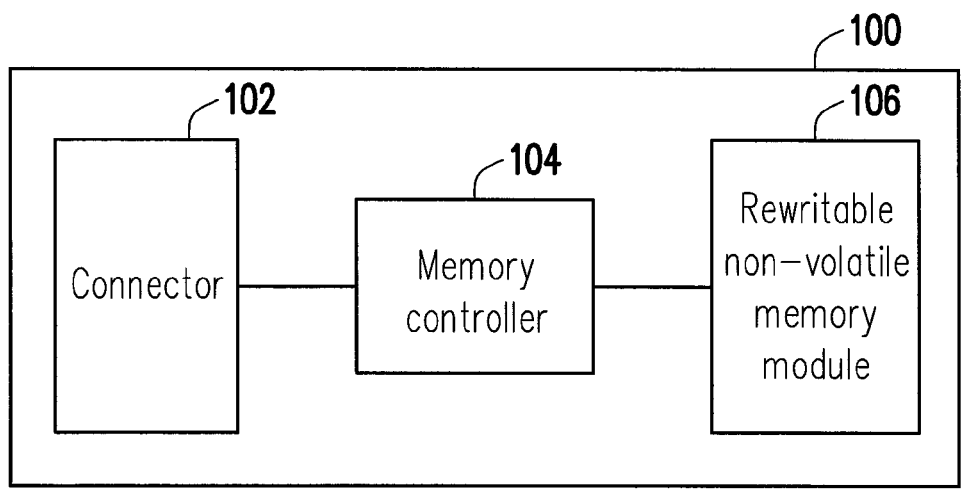
FIG. 5 is a schematic block diagram illustrating a memory storage apparatus according to an exemplary embodiment.

FIG. 5 is a schematic block diagram illustrating a memory storage apparatus according to an exemplary embodiment.

Referring to FIG. 5, the memory storage apparatus 100 includes a connector 102, a memory controller 104, and a rewritable non-volatile memory module 106.

In the present exemplary embodiment, the connector 102 is a connector complying with universal serial bus (USB). However, it should be understood that the present invention is not limited thereto, and the connector 102 may also comply with the parallel advanced technology attachment (PATA) standard, the Institute of Electrical and Electronic Engineers (IEEE) 1394 standard, the peripheral component interconnect (PCI) express standard, the secure digital (SD) standard, the serial advanced technology attachment (SATA) standard, the ultra high speed-I (UHS-I) interface standard, the ultra high speed-II (UHS-II) interface standard, the memory stick (MS) interface standard, the multi media card (MMC) interface standard, the eMMC interface standard, the universal flash storage (UFS) interface standard, the compact flash (CF) standard, the integrated device electronics (IDE) standard, or other suitable standards.

The memory controller 104 is configured to execute a plurality of logic gates or control commands which are implemented in a hardware form or in a firmware form and performing the operations such as data writing, reading or erasing in the rewritable non-volatile memory module 106 according to the command of the host system 1000.

The rewritable non-volatile memory module 106 is coupled to the memory controller 104 and is configured to store the data written by the host system 1000. In the present exemplary embodiment, the rewritable non-volatile memory module 106 is a multi level cell (MLC) NAND flash memory module (i.e., a memory cell can store 2 bits of data), a trinary level cell (TLC) NAND flash memory module (i.e., a memory cell can store 3 bits of data), other flash memory module or other memory module having the same characteristic.

Figure 6:
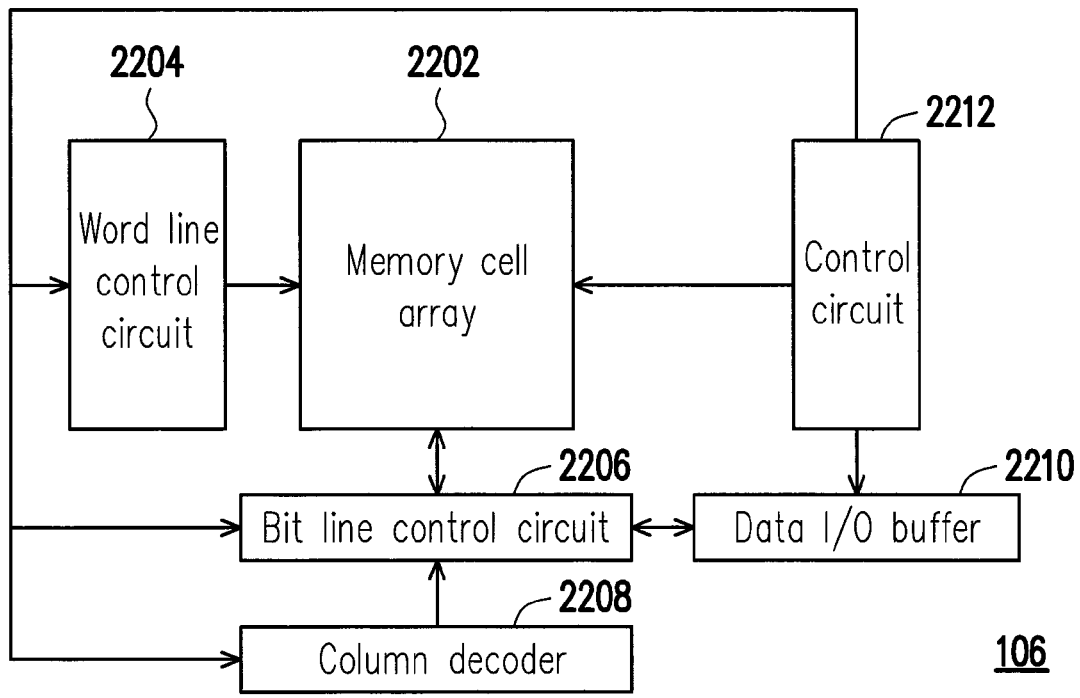
FIG. 6 is a schematic block diagram of a rewritable non-volatile memory module according to an exemplary embodiment.

FIG. 6 is a schematic block diagram of a rewritable non-volatile memory module according to an exemplary embodiment.

Referring to FIG. 6, the rewritable non-volatile memory module 106 includes a memory cell array 2202, a word line control circuit 2204, a bit line control circuit 2206, a column decoder 2208, a data input/output (I/O) buffer 2210, and a control circuit 2212.

Figure 7:
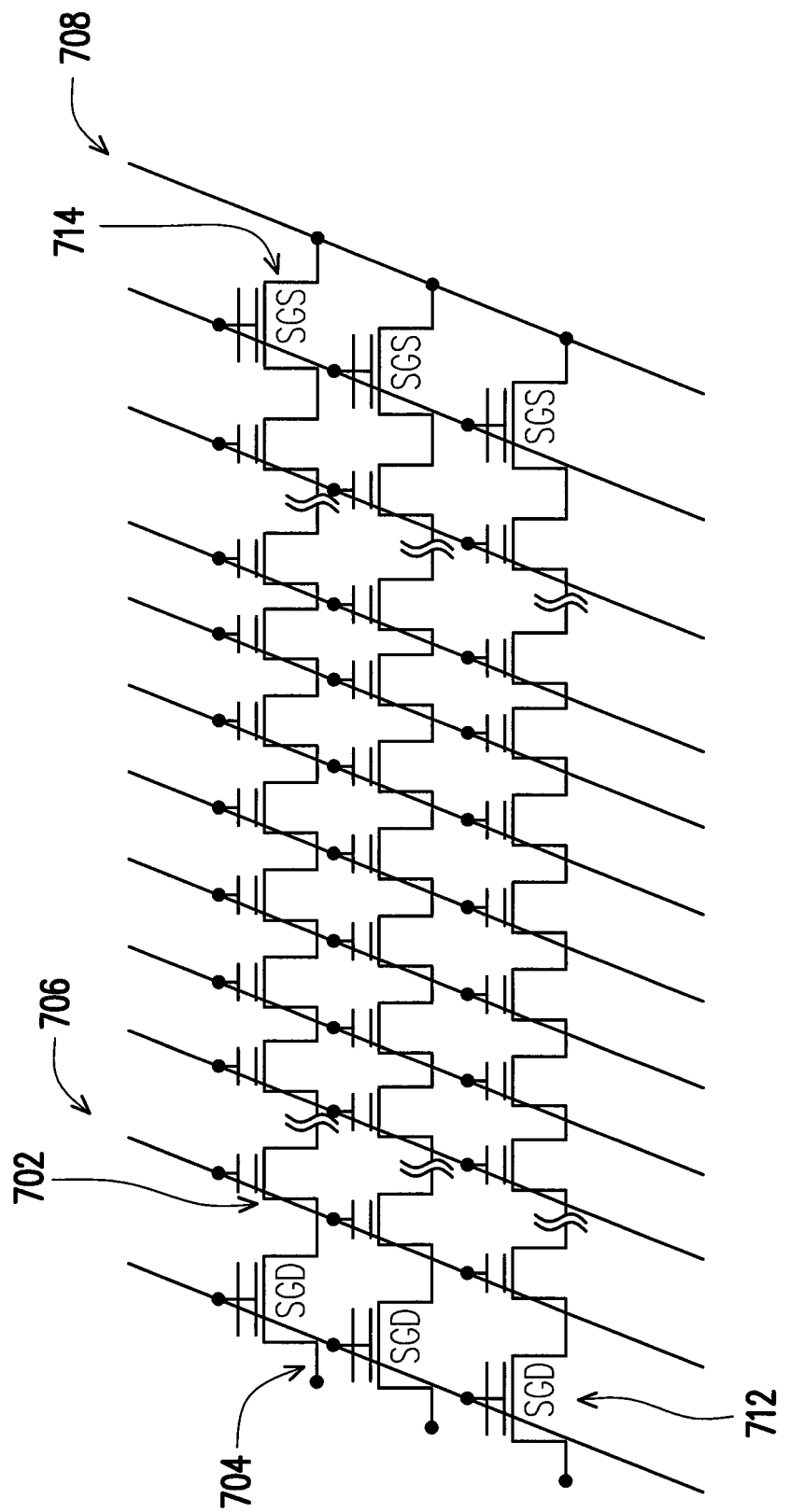
FIG. 7 is a schematic diagram illustrating a memory cell array according to an exemplary embodiment.

The memory cell array 2202 includes a plurality of memory cells 702 for storing data, a plurality of select gate drain (SGD) transistors 712, a plurality of select gate source (SGS) transistors 714, a plurality of bit lines 704 for connecting the memory cells, a plurality of word lines 706, and a common source line 708 (as shown in FIG. 7). The memory cells 702 are disposed on the cross points of the bit lines 704 and the word lines 706 as an array. When a write command or a read command is received from the memory controller 104, the control circuit 2212 controls the word line control circuit 2204, the bit line control circuit 2206, the column decoder 2208, and the data I/O buffer 2210 to write data into the memory cell array 2202 or read data from the memory cell array 2202, wherein the word line control circuit 2204 is configured to control the voltage applied to the word lines 706, the bit line control circuit 2206 is configured to control the voltage applied to the bit lines 704, the column decoder 2208 selects the corresponding bit line according to the decoding column address in the command, and the data I/O buffer 2210 is configured to store the data temporarily.

The rewritable non-volatile memory module 106 is an MLC NAND flash memory module which employs a plurality of gate voltages for representing a multi-bit data. To be specific, each memory cell of the memory cell array 2202 has a plurality of states, and the states are distinguished by a plurality of threshold voltages.

Figure 8:
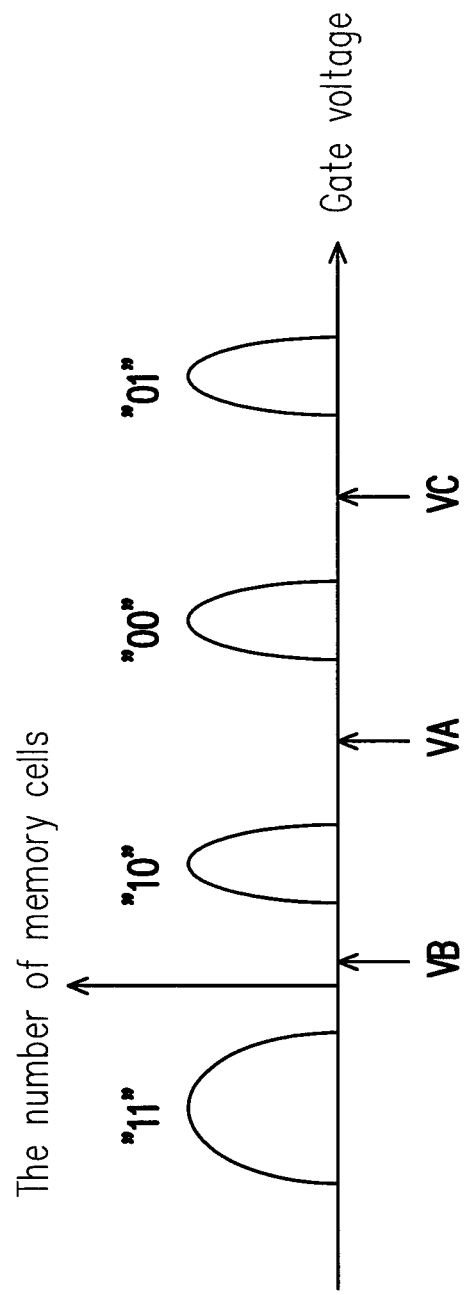
FIG. 8 is a statistical distribution diagram illustrating gate voltages corresponding to data stored in a memory array according to an exemplary embodiment.

FIG. 8 is a statistical distribution diagram illustrating gate voltages corresponding to data stored in a memory array according to an exemplary embodiment.

Referring to FIG. 8, in an exemplary MLC NAND flash memory, the gate voltages in each memory cell may be categorized into 4 storage states according to a first threshold voltage VA, a second threshold voltage VB, and a third threshold voltage VC, and these storage states respectively represent "11", "10", "00", and "01". In other words, each storage state includes the least significant bit (LSB) and the most significant bit (MSB). In the present exemplary embodiment, the first bit from the left of the storage states (i.e., "11", "10", "00", and "01") is the LSB, and the second bit from the left of the storage states is the MSB. Therefore, in the first exemplary embodiment, each memory cell stores 2 bits of data. It should be understood that the gate voltages and the corresponding storage states illustrated in FIG. 8 are only examples. In another exemplary embodiment of the present invention, the gate voltages and the corresponding storage states may also have such an arrangement as "11", "10", "01", and "00" along with the increase in the gate voltages. Alternatively, the storage states corresponding to the gate voltages may also be values obtained by mapping or inverting actual storage values. Besides, in yet anther exemplary embodiment, the first bit from the left may be defined as the MSB, and the second bit from the left may be defined as the LSB.

In a case where each memory cell stores 2 bits of data, the memory cells on the same word line constitute a storage space of 2 physical pages (i.e., a lower page and an upper page). Namely, the LSB of each memory cell corresponds to the lower page, and the MSB of each memory cell corresponds to the upper page. In addition, several physical pages in the memory cell array 2202 constitute a physical block, and the physical block is the smallest unit for erasing data. That is to say, each of the physical blocks has a minimum number of memory cells for being erased altogether.

To write (or to program) data to a memory cell of the memory cell array 2202, a voltage (e.g., a gate voltage)

applied to a certain terminal in the memory cell is controlled to change the electron volume in a charge-trapping layer in the gate, so that the conduction state of the channel of the memory cell is changed to present a different storage state. For instance, when the data of the lower page is 1, and the data of the upper page is 1 as well, the control circuit 2212 controls the word line control circuit 2204 not to change the gate voltage in the memory cell, so as to keep the storage state of the memory cell as "11". When the data of the lower page is 1, and the data of the upper page is 0, the control circuit 2212 controls the word line control circuit 2204 to change the gate voltage in the memory cell, so as to change the storage state of the memory cell to "10". When the data of the lower page is 0, and the data of the upper page is 0 as well, the control circuit 2212 controls the word line control circuit 2204 to change the gate voltage in the memory cell, so as to change the storage state of the memory cell to "00". And, when the data of the lower page is 0, and the data of the upper page is 1, the control circuit 2212 controls the word line control circuit 2204 to change the gate voltage in the memory cell, so as to change the storage state of the memory cell to "01".

Figure 9:
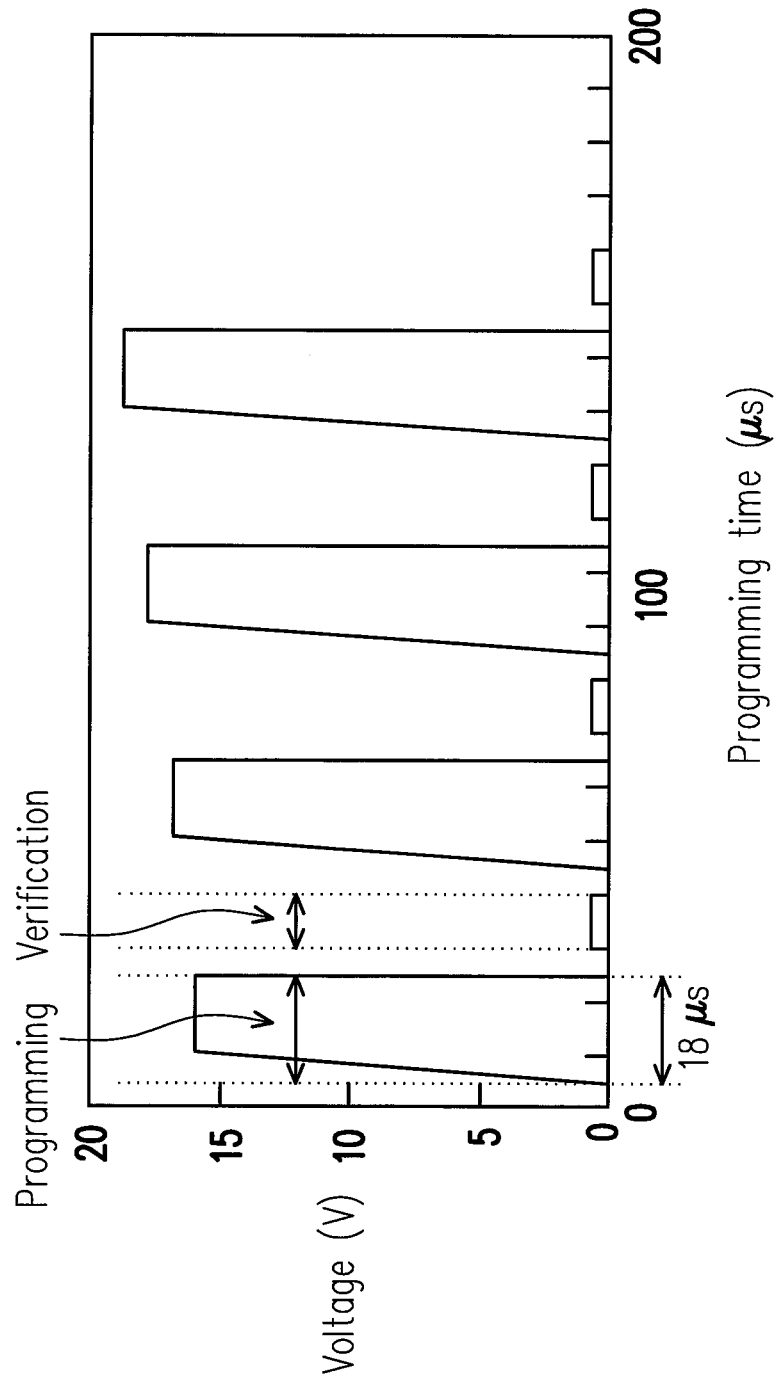
FIG. 9 is a schematic diagram of programming a memory cell according to an exemplary embodiment.

FIG. 9 is a schematic diagram of programming a memory cell according to an exemplary embodiment.

Referring to FIG. 9, in the present exemplary embodiment, the memory cell is programmed through applying a pulse writing/threshold voltage verifying method. Particularly, when data are to be written into the memory cell, the memory controller 104 determines an initial writing voltage and a writing voltage pulse time and instructs the control circuit 2212 of the rewritable non-volatile memory module 106 to program the memory cell according to the determined initial writing voltage and the determined writing voltage pulse time, thereby writing the data into the memory cell. The memory controller 104 then verifies the memory cell by means of a verification voltage, so as to determine whether the memory cell is in the correct storage state. If the memory cell is not programmed to be in the correct storage state, the memory controller 104 instructs the control circuit 2212 to re-program the memory cell according to the determined writing voltage pulse time and a new writing voltage (also referred to as a repetitive writing voltage) obtained by adding an incremental-step-pulse programming (ISPP) adjustment value to the initial writing voltage. By contrast, if the programmed memory cell is in the correct storage state, it indicates that the data are correctly written into the memory cell. For instance, the initial writing voltage is set as 16 V, the writing voltage pulse time is set as 18 microseconds (μs), and the ISPP adjustment value is set as 0.6 V; however, the present invention is not limited thereto.

Figure 10:
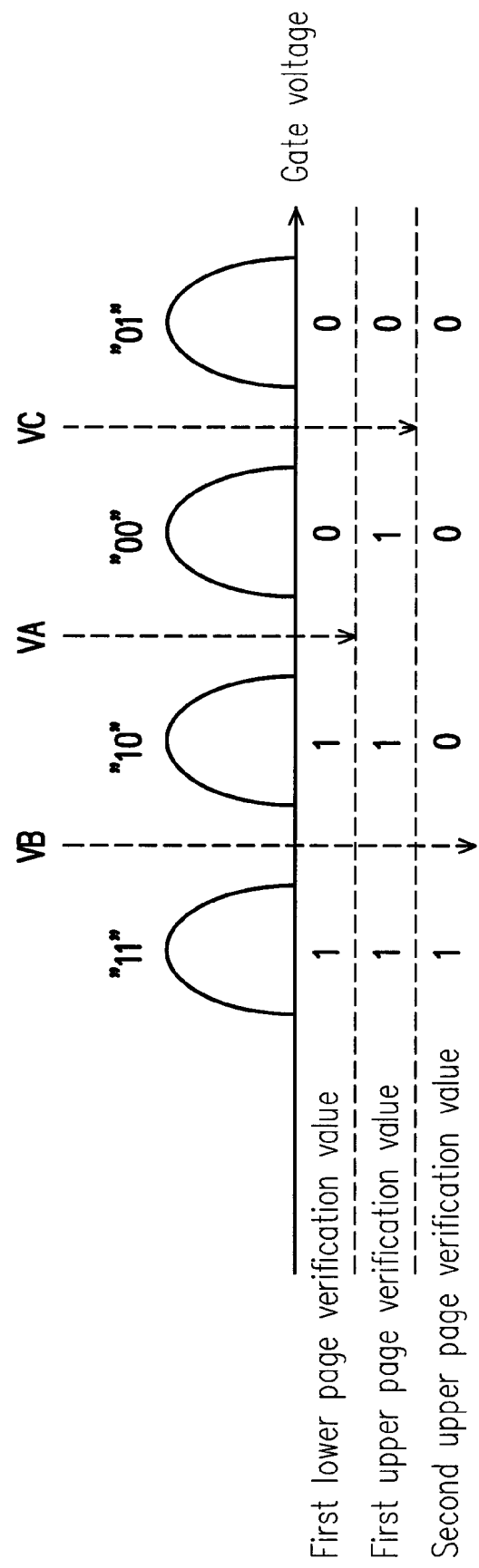
FIG. 10 is a schematic diagram of reading data from a memory cell according to an exemplary embodiment.

FIG. 10 is a schematic diagram of reading data from a memory cell according to an exemplary embodiment, wherein a MLC NAND flash memory is taken as an example.

Referring to FIG. 10, in order to read data from a memory cell of the memory cell array 2202, a voltage for reading data is applied to a control gate; by means of the conduction state of a channel of the memory cell, the data stored in the memory cell may be indicated. Here, the channel of the memory cell refers to an electrical connection path between the bit lines and the source lines of the memory cell (e.g., the path between the source and the drain of the memory cell). In an operation for reading data from a lower page, the word line control circuit 2204 applies the first read voltage VA (as the voltage for reading data) to the memory cell and determines the value of data of the lower page according to whether the channel of the memory cell is conducted and the corresponding expression (1):

$$LSB=(VA)Lower\_pre1 \qquad (1)$$

In the expression (1), (VA)Lower_pre1 represents a first lower page verification value obtained by applying the first read voltage VA.

For instance, when the first read voltage VA is lower than the gate voltage in the memory cell, the channel of the memory cell is not conducted, and a first lower page verification value, which is '0', is output. Accordingly, the LSB is indicated to be in a first state as 0. For instance, when the first read voltage VA is higher than the gate voltage in the memory cell, the channel of the memory cell is conducted, and the first lower page verification value, which is '1', is output. Accordingly, the LSB is indicated as being in a second state. Here, the first state is indicated as "0," and the second state is indicated as "1". That is, the gate voltage for presenting the LSB as "1" and the gate voltage for presenting the LSB as "0" may be distinguished by the first read voltage VA.

In an operation for reading data from an upper page, the word line control circuit 2204 respectively applies the second read voltage VB and the third read voltage VA to the memory cell and determines the value of data of the upper page according to whether the channel of the memory cell is conducted and the corresponding expression (2):

$$MSB=((VB)Upper\_pre2)xor(\sim(VC)Upper\_pre1) \qquad (2)$$

In the expression (2), (VC)Upper_pre1 represents a first upper page verification value obtained by applying the third read voltage VC, and (VB)Upper_pre2 represents a second upper page verification value obtained by applying the second read voltage VB, wherein the symbol "~" represents inversion. Additionally, in the present exemplary embodiment, when the third read voltage VC is lower than the gate voltage in the memory cell, the channel of the memory cell is not conducted, and the first upper page verification value ((VC)Upper_pre1), which is '0', is output; when the second read voltage VB is lower than the gate voltage in the memory cell, the channel of the memory cell is not conducted, and a second upper page verification value ((VB)Upper_pre2), which is '0', is output.

Thus, in the present exemplary embodiment, according to the expression (2), it is assumed that the third read voltage VC and the second read voltage VB are both lower than the gate voltage in the memory cell. When the third read voltage VC is applied, the channel of the memory cell is not conducted, and a first upper page verification value, which is '0', is output; when the second read voltage VB is applied, the channel of the memory cell is not conducted, and a second upper page verification value, which is '0', is output. At this time, the MSB is indicated as being in the second state, i.e., "1".

For instance, it is assumed that the third read voltage VC is higher than the gate voltage of the memory cell, and the second read voltage VB is lower than the gate voltage of the memory cell. When the third threshold voltage VC is applied, the channel of the memory cell is conducted, and a first upper page verification value, which is '1', is output; when the second read voltage VB is applied, the channel of the memory cell is not conducted, and a second upper page verification value, which is '0', is output. At this time, the MSB is indicated as being in a first state, i.e., "0".

For instance, it is assumed that the third read voltage VC and the second read voltage VB are both higher than the gate voltage of the memory cell. When the third read voltage VC is applied, the channel of the memory cell is conducted, and a first upper page verification value, which is '1', is output;

when the second read voltage VB is applied, the channel of the memory cell is conducted, and a second upper page verification value, which is '1', is output. At this time, the MSB is indicated as being in the second state, i.e., "1".

It should be understood that the exemplary MLC NAND flash memory described herein should not be construed as limitation to the present invention, and data can be read from any other MLC NAND flash memory through the principle described above.

Figure 11:
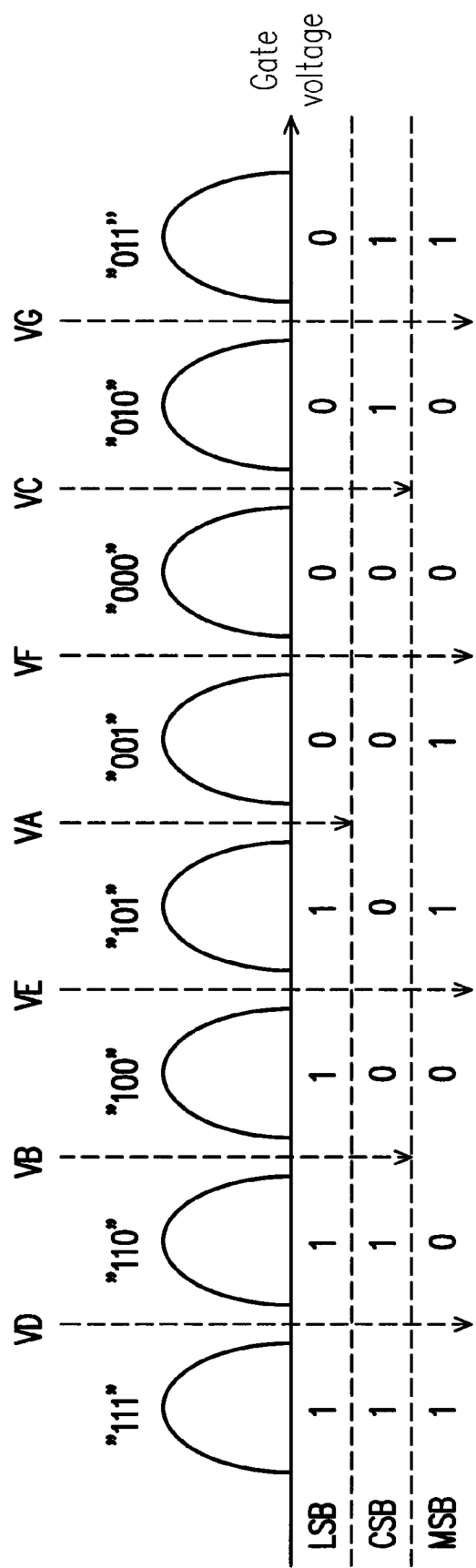
FIG. 11 is a schematic diagram of reading data from a memory cell according to another exemplary embodiment.

For instance, in an exemplary TLC NAND flash memory (as shown in FIG. 11), each storage state includes an LSB (the first bit from the left), a center significant bit (CSB, the second bit from the left), and an MSB (the third bit from the left), wherein the LSB corresponds to a lower page, the CSB corresponds to a center page, and the MSB corresponds to an upper page. In this example, the gate voltage in each memory cell is distinguished into 8 storage states (i.e., "111", "110", "100", "101", "001", "000", "010", and "011") according to a first read voltage VA, a second read voltage VB, a third read voltage VC, a fourth read voltage VD, a fifth read voltage VE, a sixth read voltage VF, and a seventh read voltage VG.

Figure 12:
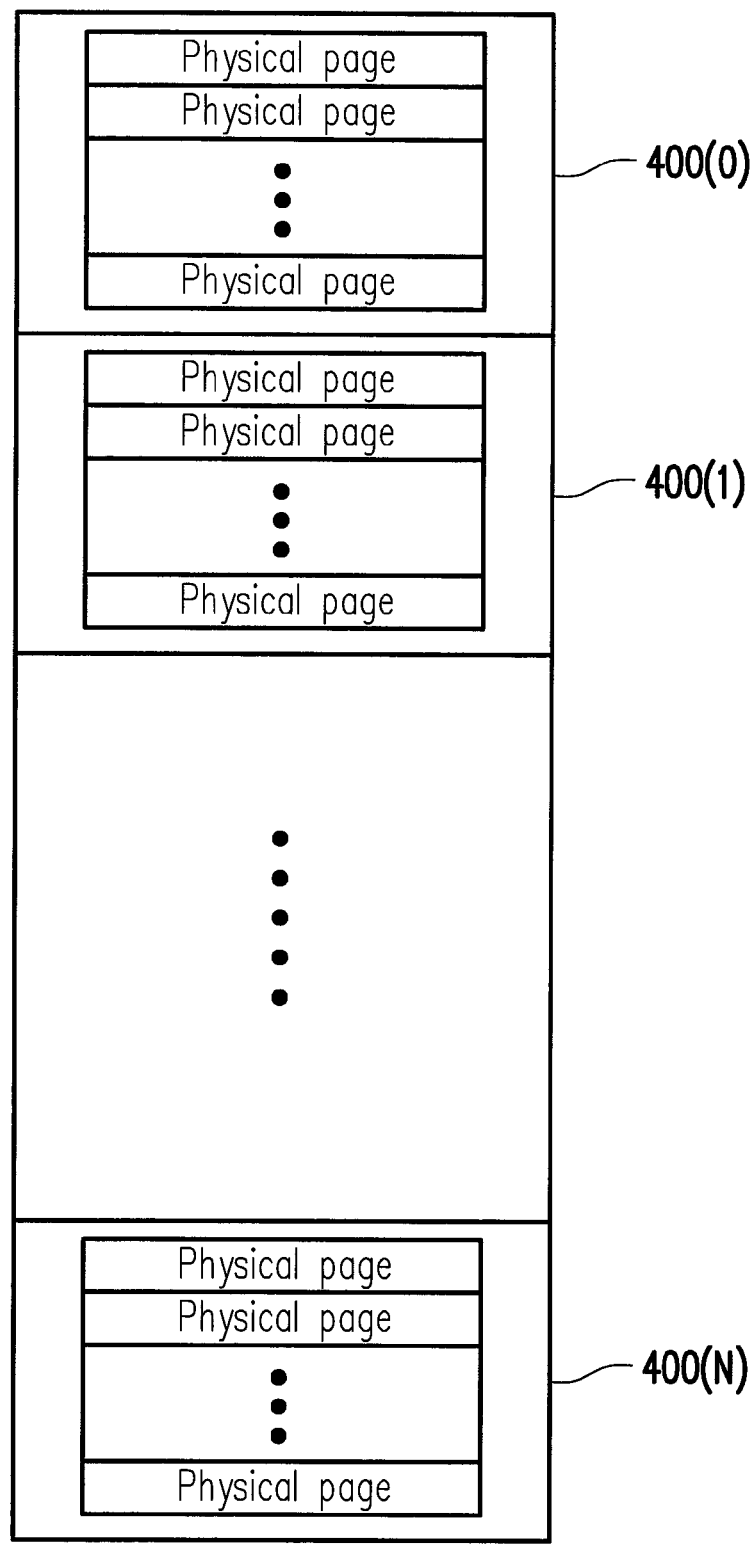
FIG. 12 is a schematic diagram of managing a rewritable non-volatile memory module according to an exemplary embodiment of the present invention.

FIG. 12 is a schematic diagram of managing a rewritable non-volatile memory module according to an exemplary embodiment of the present invention.

Referring to FIG. 12, the memory controller 104 (or the memory management circuit 202) writes data into the memory cells 702 of the rewritable non-volatile memory module 106 in units of each physical page and erases data from the memory cells 702 of the rewritable non-volatile memory module 106 in units of each physical block. Particularly, the memory cells 702 in the rewritable non-volatile memory module 106 constitute a plurality of physical pages, and the physical pages constitute a plurality of physical blocks 400(0)-400(N). Each physical block is the smallest erasing unit. Namely, each physical block contains the least number of memory cells which are erased all together. Each physical page is the smallest unit for programming data. Namely, each physical page is the smallest unit for writing data. Each physical page usually includes a data bit area and a redundant bit area. The data bit area includes a plurality of physical access address for storing user data, and the redundant bit area is used for storing system data (e.g., error checking and correcting (ECC) codes). For instance, in an exemplary TLC NAND flash memory, the LSBs of the memory cells on the same word line constitute a lower physical page; the CSBs of the memory cells on the same word line constitute a center physical page; the MSBs of the memory cells on the same word line constitute an upper physical page.

Figure 13:
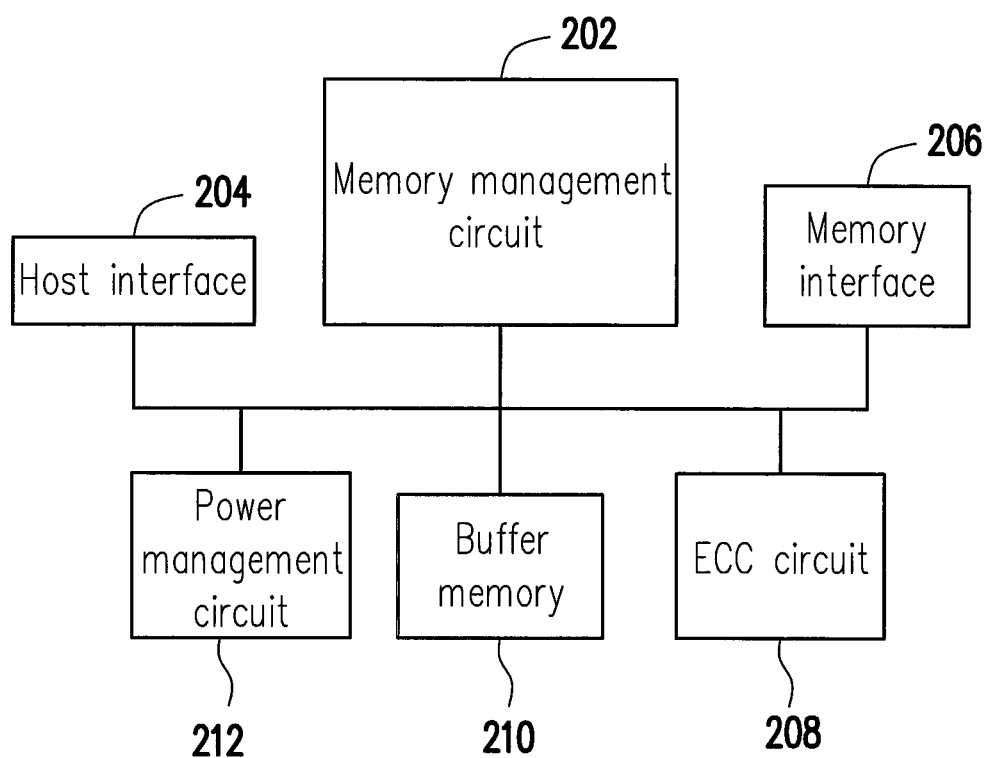
FIG. 13 is a schematic block diagram illustrating a memory controller according to an exemplary embodiment.

FIG. 13 is a schematic block diagram illustrating a memory controller according to an exemplary embodiment. It should be understood that the memory controller depicted in FIG. 13 is merely exemplary and should not be construed as a limitation to the present invention.

Referring to FIG. 13, the memory controller 104 includes a memory management circuit 202, a host interface 204, a memory interface 206 and an error checking and correcting circuit 208.

The memory managing circuit 202 is configured to control the whole operation of the memory controller 104. Particularly, the memory management circuit 202 has a plurality of control instructions; when the memory storage apparatus 100 is operated, the control instructions are executed to perform a data writing operation, a data reading operation, a data erasing operation, and so on.

In the present exemplary embodiment, the control instructions of the memory managing circuit 202 are implemented in a firmware form. For example, the memory managing circuit 202 includes a microprocessor unit (not shown) and a read-only memory (ROM, not shown), wherein the control instructions are burnt in the read-only memory. When the memory storage apparatus 100 is operated, the control instructions are executed by a microprocessor unit to write, read, and erase data.

In another exemplary embodiment of the present invention, the control commands of the memory management circuit 202 may also be stored in a specific block (for example, a system block in a memory module exclusively used for storing system data) of the rewritable non-volatile memory module 106 as a programming code. Moreover, the memory management circuit 202 includes a microprocessor unit (not shown), a read-only memory (ROM, not shown) and a random access memory (not shown). In particular, the ROM has boot codes, and when the memory controller 104 is enabled, the microprocessor unit first executes the boot codes to load the control instructions from the rewritable non-volatile memory module 106 into the RAM of the memory management circuit 202. The microprocessor unit then executes the control instructions to write, read, and erase data.

Furthermore, as in another exemplary embodiment, the control instructions in the memory management circuit 202 are implemented in a hardware form. For example, the memory management circuit 202 includes a micro controller, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the micro controller. The memory cell management circuit is configured to manage physical blocks of the rewritable non-volatile memory module 106. The memory writing circuit is configured to issue a write command to the rewritable non-volatile memory module 106 for writing data thereto. The memory reading circuit is configured to issue a read command to the rewritable non-volatile memory module 106 for reading data therefrom. The memory erasing circuit is configured to issue an erase command to the rewritable non-volatile memory module 106 for erasing data therefrom. The data processing circuit is configured to process data to be written to the rewritable non-volatile memory module 106 or data read from the rewritable non-volatile memory module 106.

The host interface 204 is coupled to the memory management circuit 202 and configured to receive and identify the commands and the data transmitted by the host system 1000. Namely, the commands and data transmitted by the host system 1000 are passed to the memory management circuit 202 through the host interface 204. In the present exemplary embodiment, the host interface 204 complies with the USB standard. However, it should be understood that the present invention is not limited thereto, and the host interface 204 may comply with the PATA standard, the IEEE 1394 standard, the PCI express standard, the SD standard, the SATA standard, the UHS-I interface standard, the UHS-II interface standard, the MS standard, the MMC standard, the eMMC interface standard, the UFS interface standard, the CF standard, the IDE standard, or other suitable data transmission standards.

The memory interface 206 is coupled to the memory management circuit 202 for accessing the rewritable non-volatile memory module 106. In other words, the data to be written into the rewritable non-volatile memory module 106 is converted to an acceptable format for the rewritable non-volatile memory module 106 by the memory interface 206.

The error checking and correcting circuit 208 is coupled to the memory management circuit 202 and configured to perform an error checking and correcting procedure to assure the accuracy of data. To be specific, when the memory management circuit 202 reads data from the memory module 106, the error checking and correcting circuit 208 executes the ECC procedure for the read data. For example, in the exemplary embodiment, the error checking and correcting circuit 208 is a low density parity check (LDPC) circuit and stores a log likelihood ratio (LLR) value table. When the memory management circuit 202 reads data from the rewritable non-volatile memory module 106, the error checking and correcting circuit 208 executes the ECC procedure according to the read data and a corresponding LLR value in the LLR value table. It should be understood that the error checking and correcting circuit 208 may be a turbo code circuit in another exemplary embodiment.

In an exemplary embodiment of the present invention, the memory controller 104 further includes a buffer memory 210 and a power management circuit 212.

The buffer memory 210 is coupled to the memory management circuit 202 and configured to temporarily store the data and commands from the host system 1000 or the data from the rewritable non-volatile memory module 106.

The power management circuit 212 is coupled to the memory management circuit 202 and configured to control the power of the memory storage apparatus 100.

Figure 14:
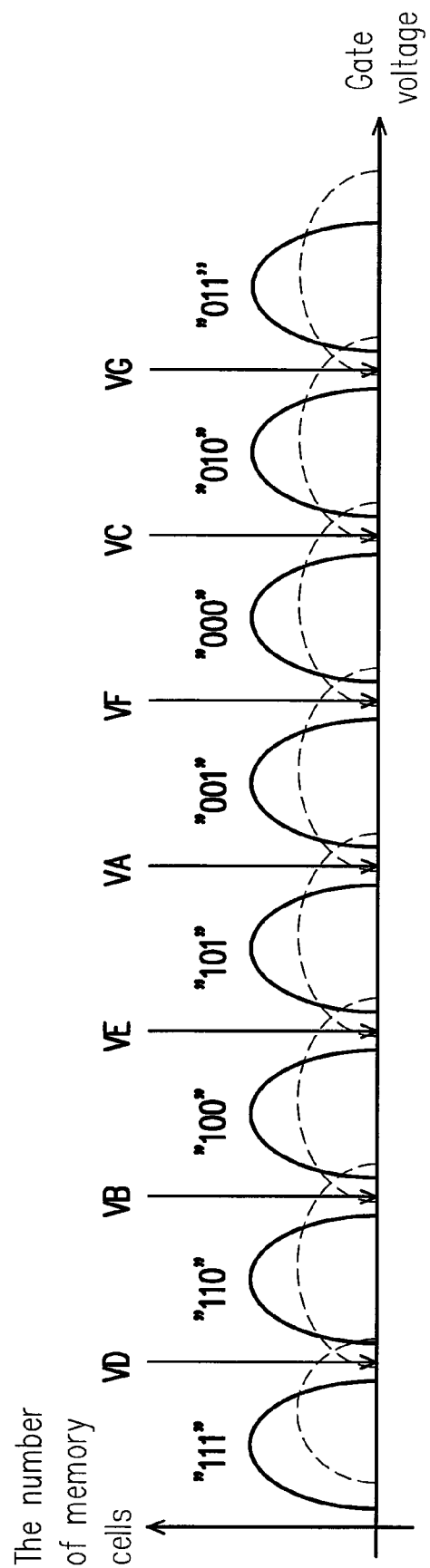
FIG. 14 is a statistical distribution diagram illustrating gate voltages corresponding to data stored in a memory array after the memory cells of the memory array are programmed and erased for many times according to an exemplary embodiment.

Generally, when reading data from memory cells, the memory controller 104 (or the memory management circuit 202) gives a read command to the rewritable non-volatile memory module 106 and the control circuit 2212 of the rewriteable non-volatile module 106 to apply default read voltages to a word line connected to the memory cells to be read, thereby verifying the conduction state of the channels of the memory cells. However, as described above, a critical voltage distribution corresponding to the memory cells of the rewritable non-volatile memory module 106 may shift due to the variation of the manufacturing process (as dotted lines shown in FIG. 14). As a result, the storage states of the memory cells are unlikely to be identified accurately by the default read voltages.

In the present exemplary embodiment, during the first-time formatting procedure for the memory storage apparatus 100, the memory controller 104 (or the memory management circuit 202) programs predetermined data (hereinafter referred to as "the test data") into the memory cells connected to each of the word lines in the rewritable non-volatile memory module 106 and reads the test data from the memory cells to obtain a critical voltage distribution corresponding to the memory cells of each of the word lines. To be specific, the memory controller 104 (or the memory management circuit 202) may apply a plurality of successively increased voltages (hereinafter referred to as "the scan voltages") to each of the word lines, so as to read a plurality of bit data (hereinafter referred to as "the scan bit data") corresponding to each of the scan voltages from the memory cells connected to the word lines, calculate an increment of scan bit data (hereinafter referred to as "the first state bit data increment"), which is identified to be at the first state, among the scan bit data obtained by applying each of the scan voltages and draw a cumulative distribution of the first state bit data increment corresponding to different scan voltages, thereby rebuilding critical voltage distributions corresponding to the memory cells of each of the word lines.

For example, in an operation of rebuilding a critical voltage distribution corresponding to memory cells of a word line (hereinafter referred to "the first word line"), the memory controller 104 (or the memory management circuit 202) may apply one unit of scan voltage to the first word line, so as to read scan bit data corresponding to the one unit of scan voltage. Then, the memory controller 104 (or the memory management circuit 202) may apply two units of scan voltage to the first word line, so as to read scan bit data corresponding to the two units of scan voltage. And, by comparing with the scan bit data obtained by applying the one unit of scan voltage, the memory controller 104 (or the memory management circuit 202) may calculate an increment of scan bit data, which is identified to be at the first state, among the scan bit data obtained by applying the two units of scan voltage. Then, the memory controller 104 (or the memory management circuit 202) may apply third units of scan voltage to the first word line, so as to read scan bit data corresponding to the third units of scan voltage. And, by comparing with the scan bit data obtained by applying the two unit of scan voltage, the memory controller 104 (or the memory management circuit 202) may calculate an increment of scan bit data, which is identified to be at the first state, among the scan bit data obtained by applying the third units of scan voltage. By the same token, the memory controller 104 (or the memory management circuit 202) may obtain the critical voltage distributions (as the dotted lines shown in FIG. 14) corresponding to the memory cells of the first word line after applying a plurality of scan voltages to the first word line and calculating the first state bit data increments corresponding to each of the scan voltage applied to the first word line.

In particular, because the critical voltage distributions corresponding to the memory cells 702 of the rewritable non-volatile memory module have shifted, in the present exemplary embodiment, the memory controller 104 (or the memory management circuit 202) estimates optimized read voltages suitable for the shifted critical voltage distributions.

To be specific, first, the memory controller 104 (or the memory management circuit 202) identifies values of default read voltages of the rewritable non-volatile memory module according to the rebuilt critical voltage distributions.

Figure 15:
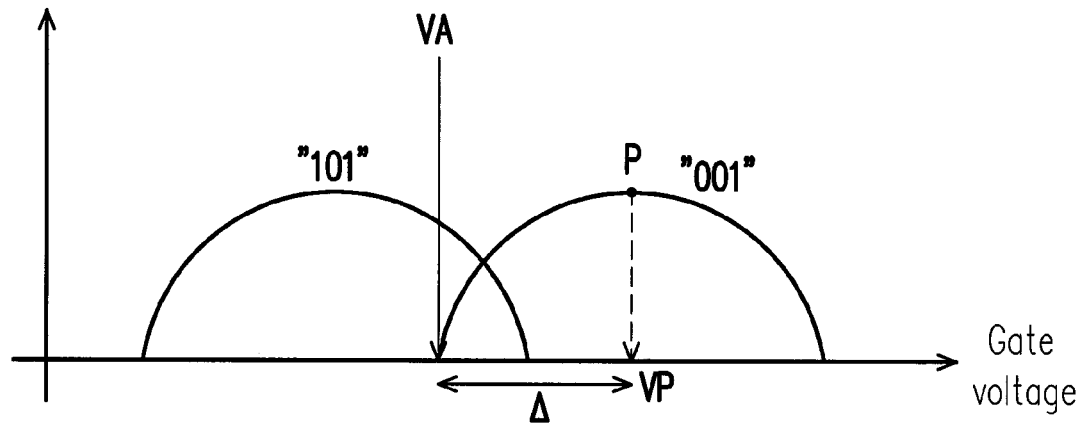
FIG. 15 illustrates an example of determining a default read voltage of a rewritable non-volatile memory module according to an exemplary embodiment of the present invention.

FIG. 15 illustrates an example of determining a default read voltage of a rewritable non-volatile memory module according to an exemplary embodiment of the present invention. It should be noted that the example in FIG. 15 is shown to explain a manner of determining a first default read voltage VA for any one of word line (hereinafter referred to "the first word line") of the rewritable non-volatile memory module 106. However, the manner may be applied to determining a second default read voltage VB, a third default read voltage VC, a fourth default read voltage VD, a fifth default read voltage VE, a sixth default read voltage VF and a seventh default read voltage VG.

Referring to FIG. 15, the memory controller 104 (or the memory management circuit 202) searches a peak (e.g., the peak P) in the rebuilt critical voltage distributions. Then, the memory controller 104 (or the memory management circuit 202) indicates the rewritable non-volatile memory module 106 adjusting the first default read voltage with successively increased voltage variations to perform read commands, and when the maximum increment of error bits in the read bit data obtained by the adjusted first default read voltage is found, the adjusted first default read voltage is identical to a scan voltage corresponding to the searched peak P. For example, first, the memory controller 104 (or the memory management circuit 202) may indicate the rewritable non-volatile memory module 106 to adjust the first default read voltage with one unit of voltage variation and apply the adjusted first default read voltage to the first word line to read data. Then, the memory controller 104 (or the memory management circuit 202) may indicate the rewritable non-volatile memory module 106 to adjust the first default read voltage with two units of voltage variation and apply the adjusted first default read voltage to the first word line to read data. By the same token, when an increment of error bits occurring the bit data read by the adjusted first default read voltage is the maximum, the memory controller 104 (or the memory management circuit 202) records the voltage variation Δ and calculates the value of the first default read voltage based on the voltage VP corresponding to the peak P. For example, if an increment of error bits occurring the bit data read by applying an adjusted first default read voltage with 10 units of voltage variation is the maximum, the adjusted first default read voltage is identical to the voltage VP corresponding to the peak P. If the value of the voltage VP corresponding to the peak P is 67 units, the memory controller 104 (or the memory management circuit 202) determines that the value of the first default read voltage is 57 units.

After determining the default read voltages of the rewritable non-volatile memory module, the memory controller 104 (or the memory management circuit 202) sets a plurality of test read voltages based on the default read voltages to read data from the memory cells and determines optimized read voltages according to the error bit numbers of the read data.

For example, after determining the first default read voltage corresponding to the first word line, the memory controller 104 (or the memory management circuit 202) indicates the rewritable non-volatile memory module 106 to apply a plurality of first test read voltages obtained by adjusting the first default read voltage to read first page data among the test data previously written into the memory cells of the first word line from the memory cells of the first word line. Then, the memory controller 104 (or the memory management circuit 202) compares the first page data obtained by applying the first test read voltages and the test data to calculate error bit numbers occurring in the read first page data. And, the memory controller 104 (or the memory management circuit 202) selects a corresponding first test read voltage as a first optimized read voltage VO based on the minimum error bit number among the calculated error bit numbers.

Figure 16:
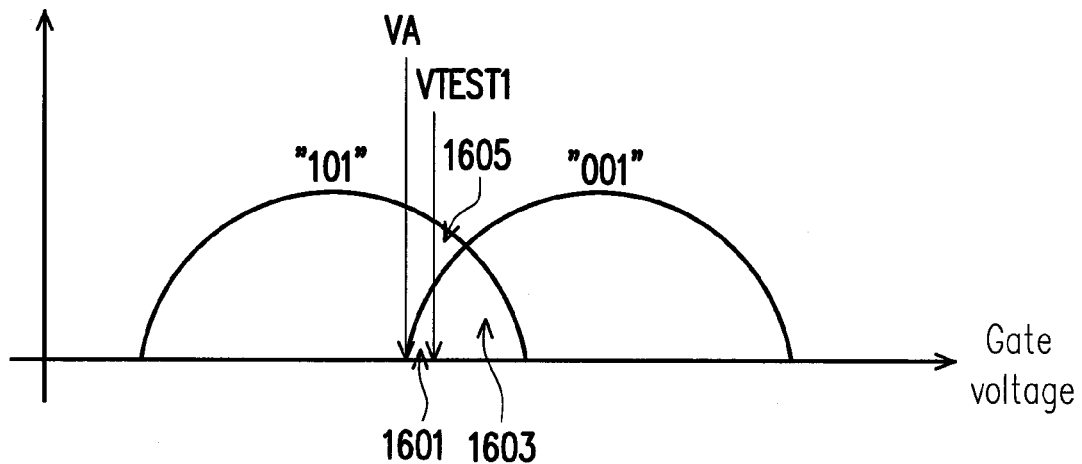
FIGS. 16~18 illustrate an example of determining an optimized read voltage of a rewritable non-volatile memory module according to an exemplary embodiment of the present invention.
Figure 17:
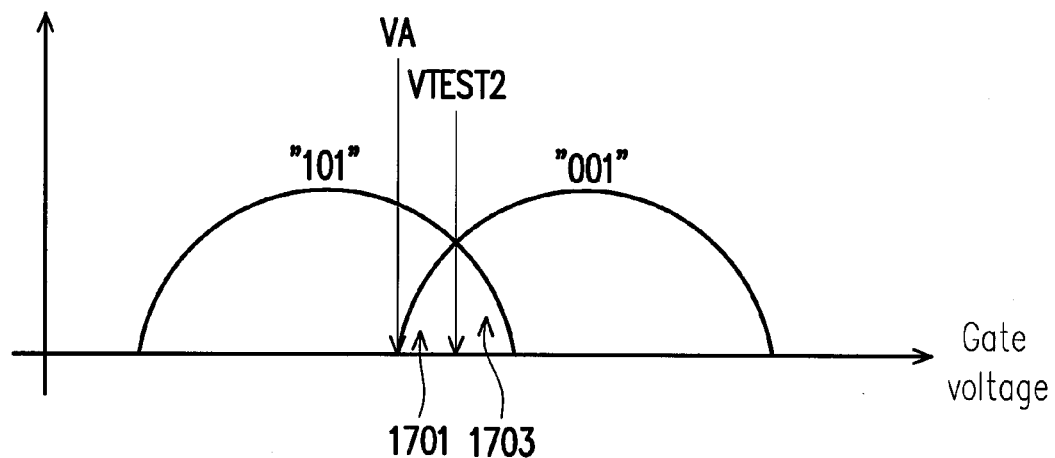
Figure 18:
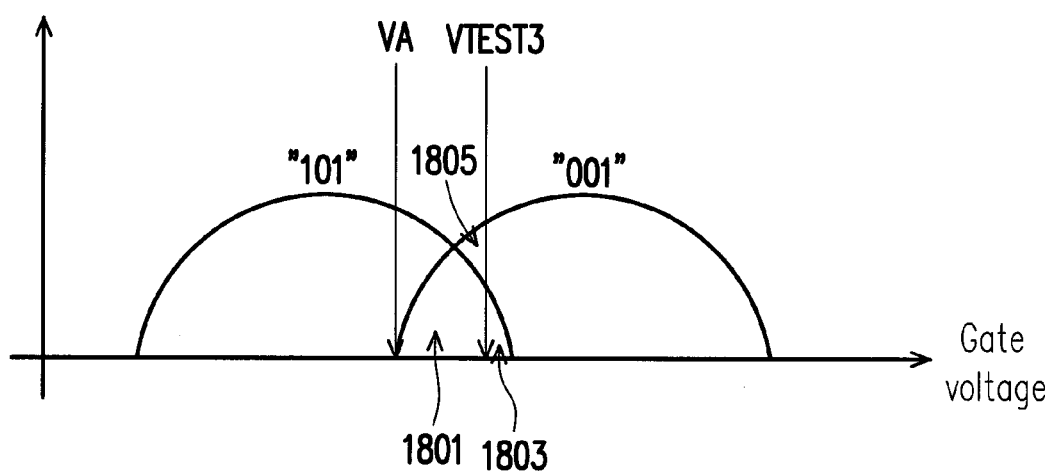

FIGS. 16~18 illustrate an example of determining an optimized read voltage of a rewritable non-volatile memory module according to an exemplary embodiment of the present invention. It should be noted that the example in FIGS. 16~18 is shown to explain a manner of determining a first optimized read voltage VA for any one of word line (hereinafter referred to "the first word line") of the rewritable non-volatile memory module 106. However, the manner may be applied to determining a second optimized read voltage, a third optimized read voltage, a fourth optimized read voltage, a fifth optimized read voltage, a sixth optimized read voltage and a seventh optimized read voltage.

Referring to FIG. 16, the memory controller 104 (or the memory management circuit 202) indicates the rewritable non-volatile memory module 106 to apply a test read voltage VTEST1 adjusted based on the first default read voltage VA to read first page data, and an error bit number of the first page data read by applying the test read voltage VTEST1 according to the test data. To be specific, the storage state of each memory cell at the block 1601 is erroneously identified as "101", but that should be "001". And, the storage state of each memory cell at the block 1603 and the block 1605 is erroneously identified as "001", but that should be "101".

Referring to FIG. 17, the memory controller 104 (or the memory management circuit 202) indicates the rewritable non-volatile memory module 106 to apply a test read voltage VTEST2 adjusted based on the first default read voltage VA to read first page data, and an error bit number of the first page data read by applying the test read voltage VTEST2 according to the test data. To be specific, the storage state of each memory cell at the block 1701 is erroneously identified as "101", but that should be "001". And, the storage state of each memory cell at the block 1703 and the block 1705 is erroneously identified as "001", but that should be "101".

Referring to FIG. 18, the memory controller 104 (or the memory management circuit 202) indicates the rewritable non-volatile memory module 106 to apply a test read voltage VTEST3 adjusted based on the first default read voltage VA to read first page data, and an error bit number of the first page data read by applying the test read voltage VTEST3 according to the test data. To be specific, the storage state of each memory cell at the block 1801 is erroneously identified as "101", but that should be "001". And, the storage state of each memory cell at the block 1803 and the block 1805 is erroneously identified as "001", but that should be "101".

As shown in FIGS. 16~18, because the number of error bits occurring in the first page data read by applying the test read voltage VTEST2 adjusted based on the first default read voltage VA is the minimum, the memory controller 104 (or the memory management circuit 202) selects the test read voltage VTEST2 as the first optimized read voltage. It should be noted that the example shown in FIGS. 16~18 is described simply with three fine-tuned test read voltages. However, the present invention is not limited thereto. Actually, the memory controller 104 (or the memory management circuit 202) may applies a plurality of test read voltages which are higher or lower than the first default read voltage VA to the word lines to read data from the memory cells, such that an optimized read voltage, by which the data having the least error bits is read, can be found.

In the present exemplary embodiment, after the first optimized read voltage corresponding to the first default read voltage VA is found, the memory controller 104 (or the memory management circuit 202) calculates a difference value between the first optimized read voltage and the first default read voltage VA as a first read voltage adjustment value and records the first read voltage adjustment value in a retry table. For example, the retry table is recorded in the rewritable non-volatile memory module 106 or a non-volatile storage unit disposed in the memory controller 104 (or the memory management circuit 202).

In particular, if page data (hereinafter referred to as "the first page data") read from a word line based on the first default read voltage VA is not correctable, the memory controller 104 (or the memory management circuit 202) indicates the rewritable non-volatile memory module 106 to adjust the first default read voltage VA according to the first read voltage adjustment value recorded in the retry table and re-read the first page data from the word line with the adjusted first default read voltage VA (i.e., the first optimized read voltage). Values recorded in the retry table are obtained according to the current critical voltage distributions (i.e., the shifted critical voltage distributions), and therefore the rewritable non-volatile memory module 106 may be access correctly.

Figure 19:
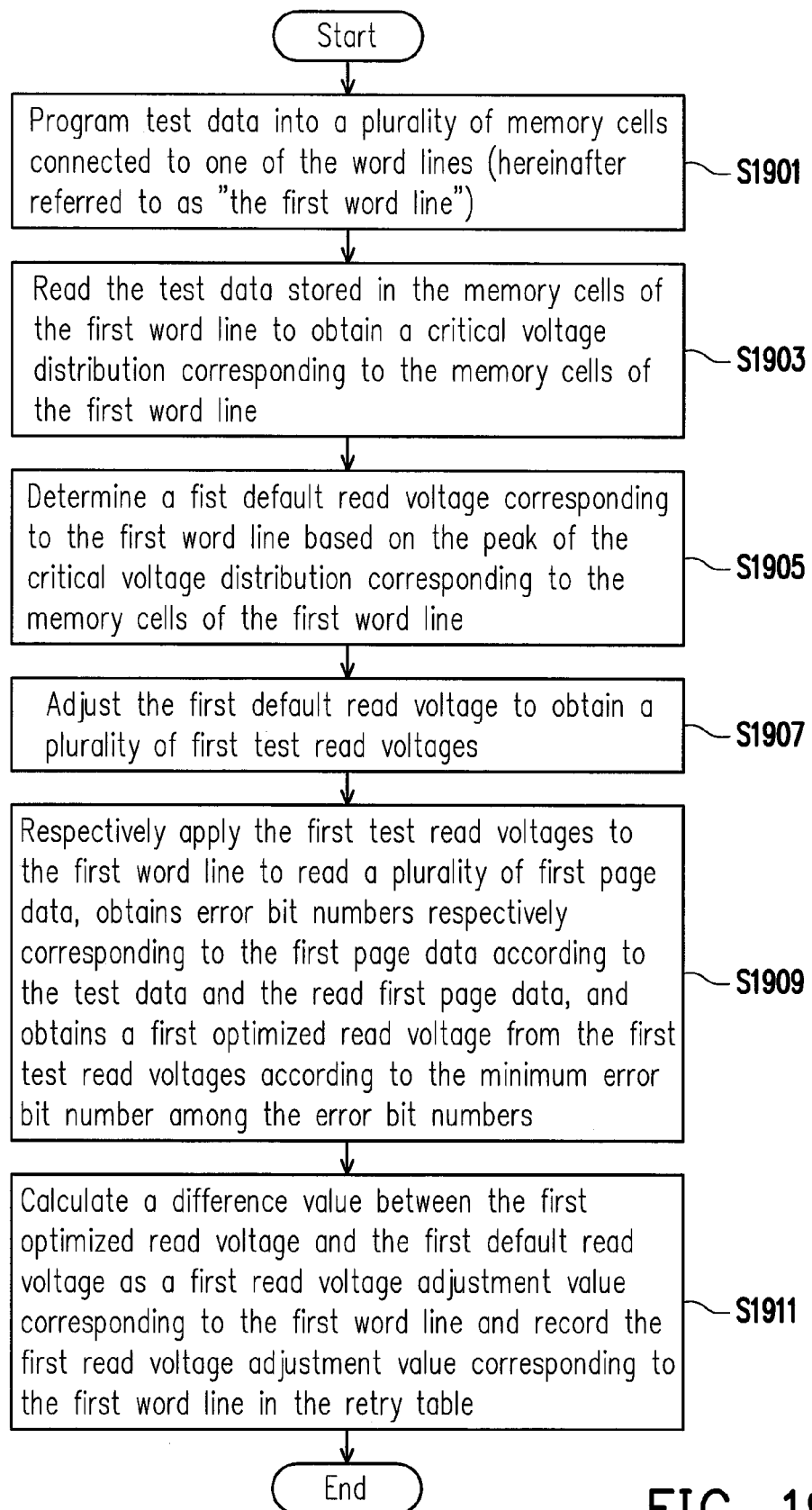
FIG. 19 is a flowchart illustrating a read voltage setting method according to an exemplary embodiment of the present invention.

FIG. 19 is a flowchart illustrating a read voltage setting method according to an exemplary embodiment of the present invention.

Referring to FIG. 19, in step S1901, the memory controller 104 (or the memory management circuit 202) programs test data into a plurality of memory cells connected to one of the word lines (hereinafter referred to as "the first word line").

In step S1903, the memory controller 104 (or the memory management circuit 202) read the test data stored in the memory cells of the first word line to obtain a critical voltage distribution corresponding to the memory cells of the first word line. The manner for rebuilding the critical voltage distribution is described above with reference to FIG. 14; therefore, no relevant descriptions are given hereinafter.

In step S1905, the memory controller 104 (or the memory management circuit 202) determines a first default read voltage corresponding to the first word line based on the peak of the critical voltage distribution corresponding to the memory cells of the first word line.

In step S1907, the memory controller 104 (or the memory management circuit 202) adjusts the first default read voltage to obtain a plurality of first test read voltages.

In step S1909, the memory controller 104 (or the memory management circuit 202) respectively applies the first test read voltages to the first word line to read a plurality of first page data, obtains error bit numbers respectively corresponding to the first page data according to the test data and the read first page data, and obtains a first optimized read voltage from the first test read voltages according to the minimum error bit number among the error bit numbers. The manner for applying the test read voltages to obtain the error bit numbers to determine the optimized read voltage is described above with reference to FIGS. 16~18; therefore, no relevant descriptions are given hereinafter.

In step S1911, the memory controller 104 (or the memory management circuit 202) calculates a difference value between the first optimized read voltage and the first default read voltage as a first read voltage adjustment value corresponding to the first word line and records the first read voltage adjustment value corresponding to the first word line in the retry table.

It should be noted that although only the steps for setting the first read voltage adjustment value corresponding to the first default read voltage VA used for the lower physical page are shown in FIG. 19; however, the same steps may be applied to setting a second read voltage adjustment value corresponding to the second default read voltage VB, a third read voltage adjustment value corresponding to the third default read voltage VC, a fourth read voltage adjustment value corresponding to the fourth default read voltage VD, a fifth read voltage adjustment value corresponding to the fifth default read voltage VE, a sixth read voltage adjustment value corresponding to the sixth default read voltage VF and a seventh read voltage adjustment value corresponding to the seventh default read voltage VG.

Figure 20:
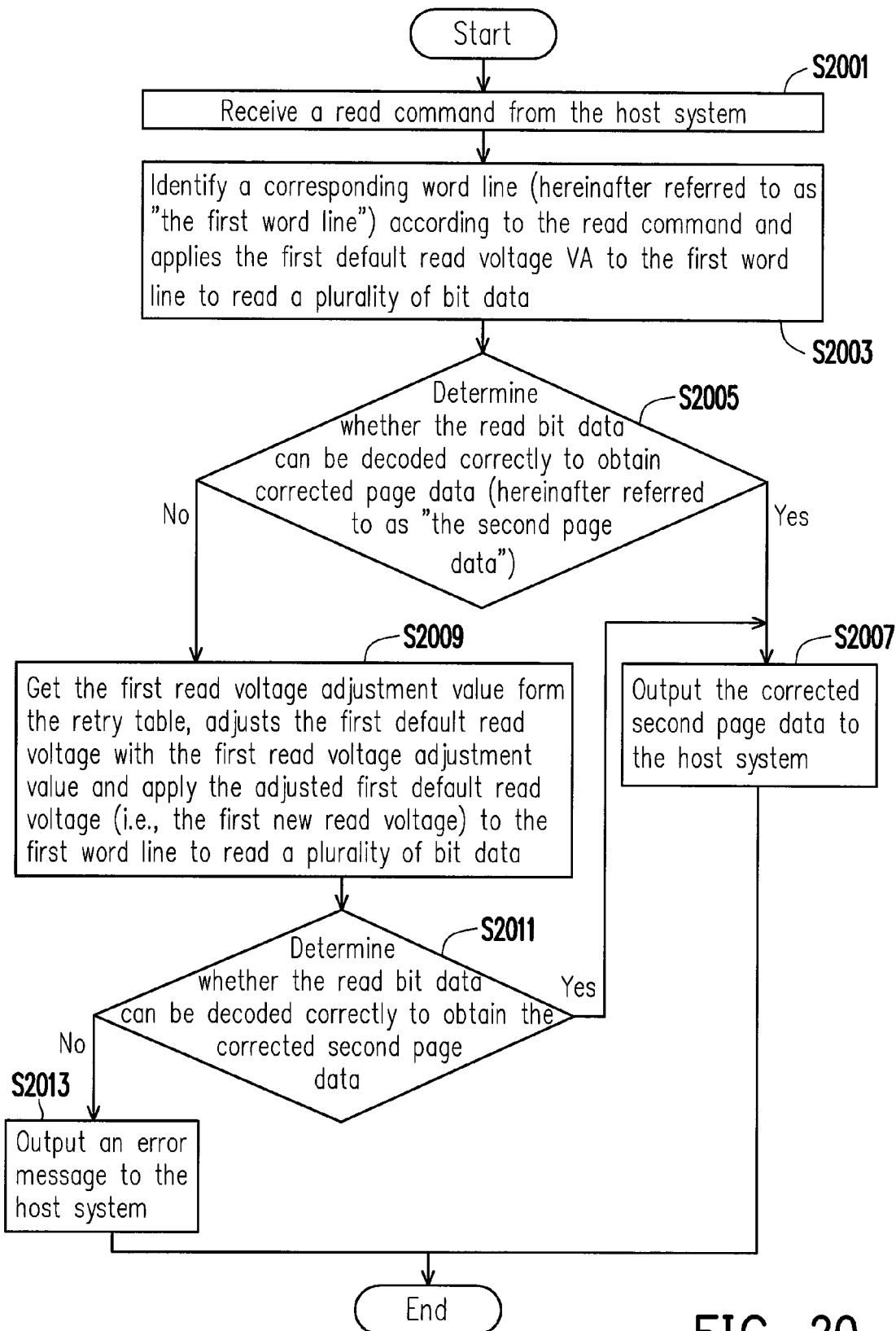
FIG. 20 is a flowchart illustrating a method for reading a lower physical page according to an exemplary embodiment of the present invention.

FIG. 20 is a flowchart illustrating a method for reading a lower physical page according to an exemplary embodiment of the present invention.

Referring to FIG. 20, in step S2001, the memory controller 104 (or the memory management circuit 202) receives a read command from the host system 1000.

Then, in step S2003, the memory controller 104 (or the memory management circuit 202) identifies a corresponding word line (hereinafter referred to as "the first word line") according to the read command and applies the first default read voltage VA to the first word line to read a plurality of bit data.

In step S2005, the memory controller 104 (or the memory management circuit 202) determines whether the read bit data can be decoded correctly to obtain corrected page data (hereinafter referred to as "the second page data").

If the read bit data can be decoded correctly to obtain corrected second page data, in step S2007, the memory controller 104 (or the memory management circuit 202) outputs the corrected second page data to the host system 1000.

If the read bit data can not be decoded correctly to obtain corrected second page data, in step S2009, the memory controller 104 (or the memory management circuit 202) gets the first read voltage adjustment value form the retry table, adjusts the first default read voltage with the first read voltage adjustment value and applies the adjusted first default read voltage (i.e., the first new read voltage) to the first word line to read a plurality of bit data. For example, in the present exemplary embodiment, the memory controller 104 (or the memory management circuit 202) may indicate the rewritable non-volatile memory module 106 to adjust the read voltages according to the read voltage adjustment values recorded in the retry table. However, the present invention is not limited thereto, and in another exemplary embodiment, the memory controller 104 (or the memory management circuit 202) may calculate the adjusted read voltages first and indicate the rewritable non-volatile memory module 106 to perform a read command according to the adjusted read voltages.

In step S2011, the memory controller 104 (or the memory management circuit 202) determines whether the read bit data can be decoded correctly to obtain the corrected second page data.

If the corrected second page data can be obtained, step S2007 is performed.

If the corrected second page data can not be obtained, in step S2013, the memory controller 104 (or the memory management circuit 202) outputs an error message to the host system 1000.

It should be noted that although only the steps for reading the lower physical page are shown in FIG. 20, however, the same steps may be applied to read the middle physical page and the upper physical page. For example, in a case of read a middle physical page, if bit data read by applying the second default read voltage VB and the third read voltage VC can not be decoded to obtain a corresponding page data, the memory controller 104 (or the memory management circuit 202) respectively uses the second read voltage adjustment value and the third read voltage adjustment value to adjust the second default read voltage VB and the third read voltage VC and applies adjusted read voltages (i.e., a second new read voltage and a third new read voltage) to obtain corrected second page data from the middle physical page. Furthermore, in a case of read a upper physical page, if bit data read by applying the fourth default read voltage VD, the fifth default read voltage VE, the sixth default read voltage VF and the seventh read voltage VG can not be decoded to obtain a corresponding page data, the memory controller 104 (or the memory management circuit 202) respectively uses the fourth read voltage adjustment value, the fifth read voltage adjustment value, the sixth read voltage adjustment value and the seventh read voltage adjustment value to adjust the fourth default read voltage VD, the fifth default read voltage VE, the sixth default read voltage VF and the seventh read voltage VG and applies adjusted read voltages (i.e., a fourth new read voltage, a fifth new read voltage, a sixth new read voltage and a seventh new read voltage) to obtain corrected page data from the upper physical page.

It should be mentioned that even though the memory management circuit 202 is implemented within the memory controller 104 in the present exemplary embodiment, the present invention is not limited thereto. In another exemplary embodiment, the memory management circuit 202 may be implemented within the control circuit of the rewritable non-volatile memory module 106 and is electrically connected to the memory array 2202 of the rewritable non-volatile memory module 106.

In view of the above, the read voltage setting method, the control circuit, and the memory storage apparatus of the exemplary embodiments of the present invention can apply suitable adjustment read voltages based on a critical voltage distribution of memory cells, thereby enhancing the capability of correcting data and preventing data stored in the memory cells from losing. The previously described exemplary embodiments of the present invention have the advantages aforementioned, wherein the advantages aforementioned not required in all versions of the invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A read voltage setting method for a rewritable non-volatile memory module, wherein the rewritable non-volatile memory module includes a plurality of memory cells, a plurality of word lines and a plurality of bit lines, each of the memory cells electrically connected to one of the word lines and one of the bit lines, each of the memory cells is configured to store a plurality of bit data, each of the plurality of bit data is identified as a first state or a second state based on a voltage, the read voltage setting method comprising:
   programming data into a plurality of memory cells connected to a first word line among the word lines;
   reading the data stored in the memory cells of the first word line to obtain a critical voltage distribution corresponding to the memory cells of the first word line; and
   determining a first default read voltage corresponding to the first word line based on a peak of the critical voltage distribution corresponding to the memory cells of the first word line.

2. The read voltage setting method according to claim 1, further comprising:
   adjusting the first default read voltage to obtain a plurality of first test read voltages;
   respectively applying the first test read voltages to the first word line to read a plurality of first page data;
   obtaining an error bit number corresponding to each of the plurality of first page data according to the data and the plurality of first page data;
   obtaining a first optimized read voltage corresponding to the first word line from the first test read voltages according to a minimum error bit number among the error bit numbers corresponding to the plurality of first page data;
   calculating a difference value between the first optimized read voltage and the first default read voltage as a first read voltage adjustment value corresponding to the first word line; and
   recording the first read voltage adjustment value corresponding to the first word line in a retry table.

3. The read voltage setting method according to claim 2, wherein the step of reading the data stored in the memory cells of the first word line to obtain the critical voltage distribution corresponding to the memory cells of the first word line comprises:
   applying a plurality of scan voltages to the word lines to read a plurality of scan bit data corresponding to each of the scan voltages from the memory cells connected to the first word line;
   respectively calculating a plurality of increments of bit data that is identified to be at the first state among the plurality of scan bit data corresponding to the scan voltages; and
   obtaining the critical voltage distribution corresponding to the memory cells of the first word line respectively according to the increments corresponding to the scan voltages.

4. The read voltage setting method according to claim 2, further comprising:
   applying the first default read voltage to read a plurality of bit data from the memory cells of the first word line;
   determining whether the plurality of bit data read from the memory cells of the first word line by applying the first default read voltage can be corrected correctly based on a corresponding error checking and correcting code to obtain a second page data; and
   if the plurality of bit data read from the memory cells of the first word line by applying the first default read voltage can not be corrected correctly based on the corresponding error checking and correcting code to obtain the second page data, using the first read voltage adjustment value to adjust the first default read voltage to obtain a first new read voltage and applying the first new read voltage to the first word line to obtain the second page data.

5. The read voltage setting method according to claim 1, wherein the step of determining the first default read voltage corresponding to the first word line based on the peak of the critical voltage distribution corresponding to the memory cells of the first word line comprises:
   searching for the peak in the critical voltage distribution; and
   obtaining a voltage variation comparing to the first default read voltage of the first word line according to the peak in the critical voltage distribution and a scan voltage corresponding to the peak among the scan voltages and identifying the first default read voltage according to the voltage variation, wherein a sum of the voltage variation and the first default read voltage is equal to the scan voltage corresponding to the peak.

6. The read voltage setting method according to claim 1, further comprising:
   determining a second default read voltage and a third default read voltage corresponding to the first word line based on the critical voltage distribution corresponding to the memory cells of the first word line;
   adjusting the second default read voltage to obtain a plurality of second test read voltages and adjusting the third default read voltage to obtain a plurality of third test read voltages;
   applying the second test read voltages and the third test read voltages to the first word line to read a plurality of third page data;
   obtaining an error bit number corresponding to each of the plurality of third page data according to the data and the plurality of third page data;
   obtaining a second optimized read voltage and a third optimized read voltage corresponding to the first word line from the second test read voltages and the third test read voltages according to a minimum error bit number among the error bit numbers corresponding to the plurality of third page data;
   calculating a difference value between the second optimized read voltage and the second default read voltage as a second read voltage adjustment value corresponding to the first word line; and
   calculating a difference value between the third optimized read voltage and the third default read voltage as a third read voltage adjustment value corresponding to the first word line; and recording the second read voltage adjustment value and the third read voltage adjustment value corresponding to the first word line in the retry table.

7. A read voltage setting method for a rewritable non-volatile memory module, wherein the rewritable non-volatile memory module includes a plurality of memory cells, a plurality of word lines and a plurality of bit lines, each of the memory cells electrically connected to one of the word lines and one of the bit lines, each of the memory cells is configured to store a plurality of bit data, each of the plurality of bit data is identified as a first state or a second state based on a voltage, the read voltage setting method comprising:

programming data into a plurality of memory cells connected to a first word line among the word lines;

adjusting a first default read voltage corresponding to the word line to obtain a plurality of first test read voltages;

respectively applying the first test read voltages to the first word line to read a plurality of first page data;

obtaining an error bit number corresponding to each of the plurality of first page data according to the data and the plurality of first page data;

obtaining a first optimized read voltage corresponding to the first word line from the first test read voltages according to a minimum error bit number among the error bit numbers corresponding to the plurality of first page data;

calculating a difference value between the first optimized read voltage and the first default read voltage as a first read voltage adjustment value corresponding to the first word line; and recording the first read voltage adjustment value corresponding to the first word line in a retry table.

8. The read voltage setting method according to claim 7, further comprising:

applying the first default read voltage to read a plurality of bit data from the memory cells of the first word line;

determining whether the plurality of bit data read from the memory cells of the first word line by applying the first default read voltage can be corrected correctly based on a corresponding error checking and correcting code to obtain a second page data; and if the plurality of bit data read from the memory cells of the first word line by applying the first default read voltage can not be corrected correctly based on the corresponding error checking and correcting code to obtain the second page data, using the first read voltage adjustment value to adjust the first default read voltage to obtain a first new read voltage and applying the first new read voltage to the first word line to obtain the second page data.

9. The read voltage setting method according to claim 7, further comprising:

adjusting a second default read voltage corresponding to the first word line to obtain a plurality of second test read voltages and adjusting a third default read voltage corresponding to the first word line to obtain a plurality of third test read voltages;

applying the second test read voltages and the third test read voltages to the first word line to read a plurality of third page data;

obtaining an error bit number corresponding to each of the plurality of third page data according to the data and the plurality of third page data;

obtaining a second optimized read voltage and a third optimized read voltage corresponding to the first word line from the second test read voltages and the third test read voltages according to a minimum error bit number among the error bit numbers corresponding to the plurality of third page data;

calculating a difference value between the second optimized read voltage and the second default read voltage as a second read voltage adjustment value corresponding to the first word line; and calculating a difference value between the third optimized read voltage and the third default read voltage as a third read voltage adjustment value corresponding to the first word line; and recording the second read voltage adjustment value and the third read voltage adjustment value corresponding to the first word line in the retry table.

10. A control circuit for accessing a rewritable non-volatile memory module, the control circuit comprising:

an interface configured to couple to the rewritable non-volatile memory module, wherein the rewritable non-volatile memory module includes a plurality of memory cells, a plurality of word lines and a plurality of bit lines, each of the memory cells electrically connected to one of the word lines and one of the bit lines, each of the memory cells is configured to store a plurality of bit data, each of the plurality of bit data is identified as a first state or a second state based on a voltage; and a memory management circuit coupled to the interface and configured to program data into a plurality of memory cells connected to a first word line among the word lines, wherein the memory management circuit is further configured to read the data stored in the memory cells of the first word line to obtain a critical voltage distribution corresponding to the memory cells of the first word line, wherein the memory management circuit is further configured to determine a first default read voltage corresponding to the first word line based on a peak of the critical voltage distribution corresponding to the memory cells of the first word line.

11. The control circuit according to claim 10, wherein the memory management circuit is further configured to adjust the first default read voltage to obtain a plurality of first test read voltages, wherein the memory management circuit is further configured to respectively apply the first test read voltages to the first word line to read a plurality of first page data, wherein the memory management circuit is further configured to obtain an error bit number corresponding to each of the plurality of first page data according to the data and the plurality of first page data, wherein the memory management circuit is further configured to obtain a first optimized read voltage corresponding to the first word line from the first test read voltages according to a minimum error bit number among the error bit numbers corresponding to the plurality of first page data, wherein the memory management circuit is further configured to calculate a difference value between the first optimized read voltage and the first default read voltage as a first read voltage adjustment value corresponding to the first word line, wherein the memory management circuit is further configured to record the first read voltage adjustment value corresponding to the first word line in a retry table.

12. The control circuit according to claim 10, wherein in the operation of reading the data stored in the memory cells of the first word line to obtain the critical voltage distribution corresponding to the memory cells of the first word line, the memory management circuit applies a plurality of scan voltages to the word lines to read a plurality of scan bit data corresponding to each of the scan voltages from the memory cells connected to the first word line, respectively calculates a plurality of increments of bit data that is identified to be at the first state among the plurality of scan bit data corresponding to the scan voltages, and obtains the critical voltage distribution corresponding to the memory cells of the first word line respectively according to the increments corresponding to the scan voltages.

13. The control circuit according to claim 10,
wherein in the operation of determining the first default read voltage corresponding to the first word line based on the peak of the critical voltage distribution corresponding to the memory cells of the first word line, the memory management circuit searches for the peak in the critical voltage distribution, obtains a voltage variation comparing to the first default read voltage of the first word line according to the peak in the critical voltage distribution and a scan voltage corresponding to the peak among the scan voltages, and identifies the first default read voltage according to the voltage variation, wherein a sum of the voltage variation and the first default read voltage is equal to the scan voltage corresponding to the peak.

14. The control circuit according to claim 10,
wherein the memory management circuit applies the first default read voltage to read a plurality of bit data from the memory cells of the first word line and determines whether the plurality of bit data read from the memory cells of the first word line by applying the first default read voltage can be corrected correctly based on a corresponding error checking and correcting code to obtain a second page data,
wherein if the plurality of bit data read from the memory cells of the first word line by applying the first default read voltage can not be corrected correctly based on the corresponding error checking and correcting code to obtain the second page data, the memory management circuit uses the first read voltage adjustment value to adjust the first default read voltage to obtain a first new read voltage and applies the first new read voltage to the first word line to obtain the second page data.

15. The control circuit according to claim 10,
wherein the memory management circuit is further configured to determine a second default read voltage and a third default read voltage corresponding to the first word line based on the critical voltage distribution corresponding to the memory cells of the first word line,
wherein the memory management circuit is further configured to adjust a second default read voltage corresponding to the first word line to obtain a plurality of second test read voltages and adjust a third default read voltage corresponding to the first word line to obtain a plurality of third test read voltages,
wherein the memory management circuit is further configured to apply the second test read voltages and the third test read voltages to the first word line to read a plurality of third page data,
wherein the memory management circuit is further configured to obtain an error bit number corresponding to each of the plurality of third page data according to the data and the plurality of third page data,
wherein the memory management circuit is further configured to obtain a second optimized read voltage and a third optimized read voltage corresponding to the first word line from the second test read voltages and the third test read voltages according to a minimum error bit number among the error bit numbers corresponding to the plurality of third page data,
wherein the memory management circuit is further configured to calculate a difference value between the second optimized read voltage and the second default read voltage as a second read voltage adjustment value corresponding to the first word line,
wherein the memory management circuit is further configured to calculate a difference value between the third optimized read voltage and the third default read voltage as a third read voltage adjustment value corresponding to the first word line,
wherein the memory management circuit is further configured to record the second read voltage adjustment value and the third read voltage adjustment value corresponding to the first word line in the retry table.

16. A memory storage apparatus, comprising:
a connector, coupled to a host system;
an rewritable non-volatile memory module, wherein the rewritable non-volatile memory module includes a plurality of memory cells, a plurality of word lines and a plurality of bit lines, each of the memory cells electrically connected to one of the word lines and one of the bit lines, each of the memory cells is configured to store a plurality of bit data, each of the plurality of bit data is identified as a first state or a second state based on a voltage; and
a memory controller coupled to the connector and the rewritable non-volatile memory module, wherein the memory controller is configured to program data into a plurality of memory cells connected to a first word line among the word lines,
wherein the memory controller is further configured to read the data stored in the memory cells of the first word line to obtain a critical voltage distribution corresponding to the memory cells of the first word line,
wherein the memory controller is further configured to determine a first default read voltage corresponding to the first word line based on a peak of the critical voltage distribution corresponding to the memory cells of the first word line.

17. The memory storage apparatus according to claim 16,
wherein the memory controller is further configured to adjust the first default read voltage to obtain a plurality of first test read voltages,
wherein the memory controller is further configured to respectively apply the first test read voltages to the first word line to read a plurality of first page data,
wherein the memory controller is further configured to obtain an error bit number corresponding to each of the plurality of first page data according to the data and the plurality of first page data,
wherein the memory controller is further configured to obtain a first optimized read voltage corresponding to the first word line from the first test read voltages according to a minimum error bit number among the error bit numbers corresponding to the plurality of first page data,
wherein the memory controller is further configured to calculate a difference value between the first optimized read voltage and the first default read voltage as a first read voltage adjustment value corresponding to the first word line,
wherein the memory controller is further configured to record the first read voltage adjustment value corresponding to the first word line in a retry table.

18. The memory storage apparatus according to claim 17, wherein in the operation of reading the data stored in the memory cells of the first word line to obtain the critical voltage distribution corresponding to the memory cells of the first word line, the memory controller applies a plurality of scan voltages to the word lines to read a plurality of scan bit data corresponding to each of the scan voltages from the memory cells connected to the first word line, respectively calculates a plurality of increments of bit data that is identified to be at the first state among the plurality of scan bit data corresponding to the scan voltages, and obtains the critical voltage distribution corresponding to the memory cells of the first word line respectively according to the increments corresponding to the scan voltages.

19. The memory storage apparatus according to claim 16, wherein in the operation of determining the first default read voltage corresponding to the first word line based on the peak of the critical voltage distribution corresponding to the memory cells of the first word line, the memory controller searches for the peak in the critical voltage distribution, obtains a voltage variation comparing to the first default read voltage of the first word line according to the peak in the critical voltage distribution and a scan voltage corresponding to the peak among the scan voltages, and identifies the first default read voltage according to the voltage variation, wherein a sum of the voltage variation and the first default read voltage is equal to the scan voltage corresponding to the peak.

20. The memory storage apparatus according to claim 16, wherein the memory controller applies the first default read voltage to read a plurality of bit data from the memory cells of the first word line and determines whether the plurality of bit data read from the memory cells of the first word line by applying the first default read voltage can be corrected correctly based on a corresponding error checking and correcting code to obtain a second page data,
wherein if the plurality of bit data read from the memory cells of the first word line by applying the first default read voltage can not be corrected correctly based on the corresponding error checking and correcting code to obtain the second page data, the memory controller uses the first read voltage adjustment value to adjust the first default read voltage to obtain a first new read voltage and applies the first new read voltage to the first word line to obtain the second page data.

21. The memory storage apparatus according to claim 16, wherein the memory controller is further configured to determine a second default read voltage and a third default read voltage corresponding to the first word line based on the critical voltage distribution corresponding to the memory cells of the first word line,
wherein the memory controller is further configured to adjust a second default read voltage corresponding to the first word line to obtain a plurality of second test read voltages and adjust a third default read voltage corresponding to the first word line to obtain a plurality of third test read voltages,
wherein the memory controller is further configured to apply the second test read voltages and the third test read voltages to the first word line to read a plurality of third page data,
wherein the memory controller is further configured to obtain an error bit number corresponding to each of the plurality of third page data according to the data and the plurality of third page data,
wherein the memory controller is further configured to obtain a second optimized read voltage and a third optimized read voltage corresponding to the first word line from the second test read voltages and the third test read voltages according to a minimum error bit number among the error bit numbers corresponding to the plurality of third page data,
wherein the memory controller is further configured to calculate a difference value between the second optimized read voltage and the second default read voltage as a second read voltage adjustment value corresponding to the first word line,
wherein the memory controller is further configured to calculate a difference value between the third optimized read voltage and the third default read voltage as a third read voltage adjustment value corresponding to the first word line,
wherein the memory controller is further configured to record the second read voltage adjustment value and the third read voltage adjustment value corresponding to the first word line in the retry table.

* * * * *